US011670528B2

(12) United States Patent
Kondo et al.

(10) Patent No.: US 11,670,528 B2
(45) Date of Patent: Jun. 6, 2023

(54) WAFER OBSERVATION APPARATUS AND WAFER OBSERVATION METHOD

(71) Applicant: Hitachi High-Tech Corporation, Tokyo (JP)

(72) Inventors: Naoaki Kondo, Tokyo (JP); Minoru Harada, Tokyo (JP); Yohei Minekawa, Tokyo (JP); Takehiro Hirai, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 346 days.

(21) Appl. No.: 16/908,386

(22) Filed: Jun. 22, 2020

(65) Prior Publication Data
US 2020/0411345 A1 Dec. 31, 2020

(30) Foreign Application Priority Data

Jun. 26, 2019 (JP) .............................. JP2019-118345

(51) Int. Cl.
H01L 21/67 (2006.01)
G06T 7/00 (2017.01)
H01L 21/66 (2006.01)

(52) U.S. Cl.
CPC ........ *H01L 21/67253* (2013.01); *G06T 7/001* (2013.01); *H01L 22/26* (2013.01);
(Continued)

(58) Field of Classification Search
CPC ... H01L 21/67253; H01L 22/26; H01L 22/12; H01L 21/67276; H01L 21/67259;
(Continued)

(56) References Cited

U.S. PATENT DOCUMENTS 10,475,710 B1 * 11/2019 Guo ...................... H01L 21/324
2003/0071980 A1 4/2003 Ina et al.
(Continued)

FOREIGN PATENT DOCUMENTS

JP 2006118870 A 5/2006
JP 2011174757 A 9/2011
(Continued)

OTHER PUBLICATIONS

Office Action dated Oct. 12, 2021 in Korean Application No. 10-2020-0052125.
(Continued)

*Primary Examiner* — Edward Chin
(74) *Attorney, Agent, or Firm* — Miles & Stockbridge, P.C.

(57) ABSTRACT

Provided is a wafer observation apparatus includes: a scanning electron microscope; a control unit which includes a wafer observation unit that observes a wafer of a semiconductor device, and an image acquisition unit that acquires a wafer image; a storage unit which includes an image storage unit that stores the wafer image and a template image, and a recipe storage unit that stores a wafer alignment recipe including a matching success and failure determination threshold value, an image processing parameter set, and a use priority associated with the template image; and a calculation unit which includes a recipe reading unit that reads the template image and the wafer alignment recipe, a recipe update necessity determination unit that determines update necessity of the wafer alignment recipe, and a recipe updating unit that updates the wafer alignment recipe based on a determination result in the recipe update necessity determination unit.

10 Claims, 26 Drawing Sheets

(52) U.S. Cl.
CPC .............. *G06T 2207/10061* (2013.01); *G06T 2207/30148* (2013.01)

(58) Field of Classification Search
CPC .................. H01L 22/20; G06T 7/001; G06T 2207/10061; G06T 2207/30148; G06T 7/337
See application file for complete search history.

(56) References Cited

U.S. PATENT DOCUMENTS

| | | |
|---|---|---|
| 2013/0234019 A1 | 9/2013 | Miyamoto et al. |
| 2015/0062571 A1 | 3/2015 | Kulkarni et al. |
| 2017/0109607 A1* | 4/2017 | Nagatomo ................ G06T 7/74 |
| 2019/0266713 A1* | 8/2019 | Kondo ................ G06V 10/245 |
| 2021/0110524 A1* | 4/2021 | Deotare ................ G01R 31/311 |

FOREIGN PATENT DOCUMENTS

| | | | | |
|---|---|---|---|---|
| JP | 201776248 A | | 4/2017 | |
| KR | 10-2003-0032871 A | | 4/2003 | |
| KR | 20030032871 A | * | 4/2003 | ........... H01L 21/027 |
| WO | 2012070549 A1 | | 5/2012 | |

OTHER PUBLICATIONS

Office Action dated Sep. 27, 2022 in Japanese Application No. 2019-118345.

\* cited by examiner

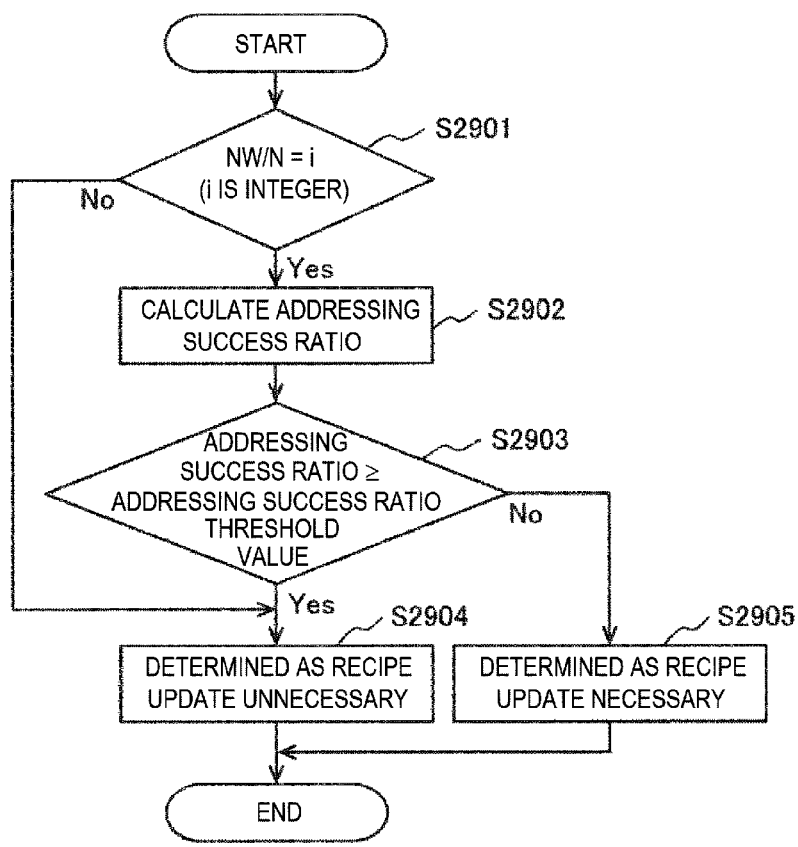

WAFER OBSERVATION APPARATUS AND WAFER OBSERVATION METHOD

CLAIM OF PRIORITY

The present application claims priority from Japanese Patent Application JP 2019-118345 filed on Jun. 26, 2019, the contents of which are hereby incorporated by reference into this application.

BACKGROUND OF THE INVENTION

Field of the Invention

The present invention relates to a wafer observation apparatus and a wafer observation method for observing a semiconductor wafer.

Description of the Related Art

In order to enhance a yield of a semiconductor device, a wafer observation apparatus that inspects or observes a semiconductor wafer during a semiconductor device manufacturing step is used. The wafer observation apparatus calculates a rotation angle and a position deviation amount of the semiconductor wafer with respect to a stage by automatically detecting a position of a unique pattern (alignment mark) whose design position is known after transporting the wafer onto the stage (hereinafter, referred to as wafer alignment).

Generally, in order to detect the alignment mark, a template matching method is used. In the template matching method, an image including the alignment mark in a field of view is registered in advance as a template image in a recipe. At the time of wafer alignment, an image (alignment image) is acquired so that the alignment mark on the semiconductor wafer is included in the field of view, the acquired alignment image is overlapped on the template image while being shifted, similarity between the images is calculated, and a location having the highest similarity is specified, thereby detecting the alignment mark.

In template matching, in order to enhance the detection accuracy by enhancing a contrast of the alignment mark in the template image and the alignment image, it is effective to apply image processing such as edge extraction and calculate a similarity using an image to which the image processing has been applied.

Further, in a case where the similarity between the template image and the alignment image is low, since it is highly probable that position detection of the alignment mark fails, it is common to compare the similarity with a matching success and failure determination threshold value to determine success and failure of the template matching.

In a wafer alignment recipe used in wafer alignment, in addition to the template image, the matching success and failure determination threshold value for determining success and failure of the template matching and an image processing parameter set used in applying the image processing are stored for each template image.

As a method for easily managing a recipe, JP-A-2011-174757 (Patent Literature 1) discloses a method of updating an inspection recipe.

In a semiconductor manufacturing line, a number of types are manufactured through a number of steps. Therefore, a wafer observation apparatus needs to observe wafers of various types and steps. Since an appearance of a circuit pattern changes when the type and the step are different, it is desirable to create and manage a recipe for each combination of the type and the step. However, in this case, since the number of recipes is enormous, appropriate management is important.

In order to efficiently manage the recipe, it is important to commonize the recipe. The recipe related to wafer alignment can be commonized as long as the appearance of the alignment mark is similar. Generally, when the type name or the step name matches, alignment marks are often similar. However, it is not necessarily limited to this, and it is necessary to determine whether or not commonality is possible by looking at the alignment mark. In addition, the similarity with the template image in the recipe may decrease due to a temporal or sudden manufacturing process change, and it is important to manage the template image, the matching success and failure determination threshold value, and the image processing parameter set.

As described above, since there are a large number of types and steps in the semiconductor manufacturing line, it is desirable that the apparatus automatically creates or automatically updates the recipe in order to perform efficient recipe management. However, in order to implement a stable recipe update, it is important to automatically select only items that need to be updated, and to update the recipe in accordance with the selected items. Patent Literature 1 does not disclose a detailed description of an update of a recipe related to wafer alignment. In particular, there is no description of a method of automatically selecting only items that need to be updated.

SUMMARY OF THE INVENTION

The invention provides a wafer observation apparatus and a wafer observation method capable of solving the above-described problems of the related art and efficiently managing a recipe by determining update necessity of a wafer alignment recipe, selecting one or more items that need to be updated from a template image or a matching success and failure determination threshold value or an image processing parameter set included in the recipe, and updating the recipe in accordance with the selected item.

To solve the problems of the related art described above, the invention provides a wafer observation apparatus that observes a wafer of a semiconductor device. The wafer observation apparatus includes: a scanning electron microscope; a control unit; a storage unit; and a calculation unit. The control unit includes a wafer observation unit that controls the scanning electron microscope to observe the wafer of the semiconductor device, and an image acquisition unit that acquires a wafer image observed by the wafer observation unit. The storage unit includes an image storage unit that stores the wafer image acquired by the image acquisition unit and a template image, and a recipe storage unit that stores a wafer alignment recipe including a matching success and failure determination threshold value, an image processing parameter set, and a use priority associated with the template image. The calculation unit includes a recipe reading unit that reads the template image stored in the image storage unit and the wafer alignment recipe stored in the recipe storage unit, a recipe update necessity determination unit that determines update necessity of the wafer alignment recipe stored in the recipe storage unit, and a recipe updating unit that updates the wafer alignment recipe based on a determination result in the recipe update necessity determination unit.

In order to solve the problems of the related art, the invention provides a wafer observation method of observing a wafer of a semiconductor device using a wafer observation apparatus that observes the wafer. The wafer observation method includes: an image acquisition step of acquiring a wafer image; a recipe reading step of reading a wafer alignment recipe including a template image, a matching success and failure determination threshold value associated with the template image, an image processing parameter set, and a use priority; a wafer alignment execution step of calculating a rotation angle and a position deviation amount of the wafer with respect to a stage of the wafer observation apparatus using the wafer alignment recipe read in the recipe reading step; a wafer observation step of observing the wafer; a recipe update necessity determination step of determining update necessity of the wafer alignment recipe; and a recipe updating step of updating the wafer alignment recipe based on a determination result in the recipe update necessity determination step.

According to the invention, the wafer alignment recipe can be updated efficiently when a plurality of items are included in the recipe in the wafer observation apparatus.

Further, according to the invention, the recipe can be efficiently managed by determining the update necessity of the wafer alignment recipe, selecting one or more items that need to be updated from a template image or a matching success and failure determination threshold value or an image processing parameter set included in the recipe, and updating the recipe in accordance with the selected item.

BRIEF DESCRIPTION OF THE DRAWINGS

FIG. 29 is a flowchart showing a processing flow of a method of determining update necessity of a wafer alignment recipe by a recipe update necessity determination unit of the wafer observation apparatus according to the fourth embodiment of the invention.

DESCRIPTION OF THE PREFERRED EMBODIMENTS

Figure 1:
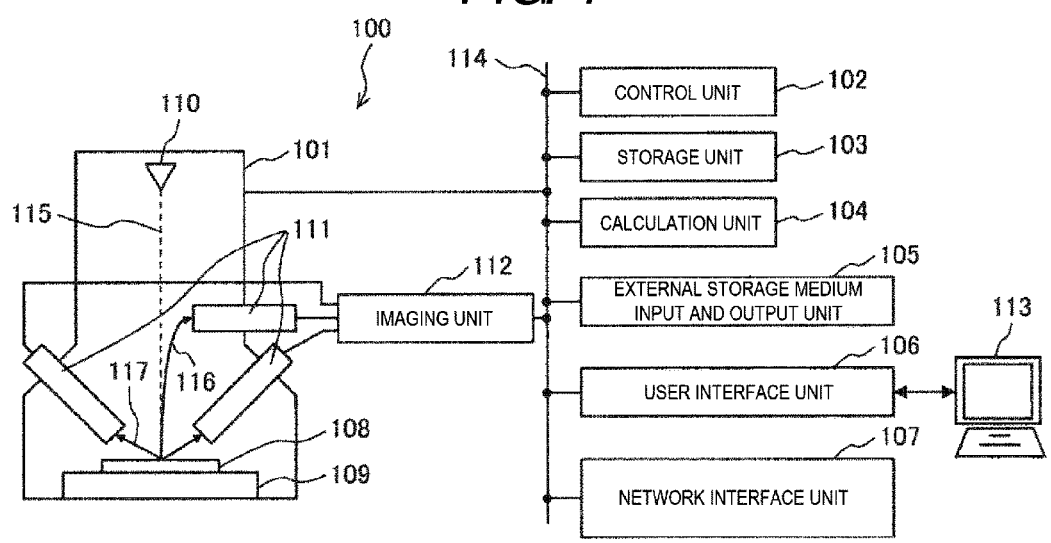
FIG. 1 is a block diagram showing a schematic configuration of a wafer observation apparatus according to a first embodiment of the invention.

A wafer observation apparatus such as a defect review scanning electron microscope (SEM) or a length measurement SEM that observes a wafer as a sample acquires an image including an alignment mark whose design position is known in the field of view after transporting the wafer on a stage, and automatically detects a position of the alignment mark whose design position is known using the acquired image, a template image, a matching success and failure determination threshold value, and an image processing parameter set in a wafer alignment recipe created in advance (hereinafter, may be simply referred to as a recipe), thereby calculating a rotation angle and a position deviation amount of the sample wafer with respect to the stage.

In a semiconductor manufacturing line, a number of types are manufactured through a number of steps. Therefore, a wafer observation apparatus needs to observe wafers of various types and steps. Since an appearance of a circuit pattern changes when the type and the step are different, it is desirable to create and manage the recipe for each combination of the type and the step. However, in this case, since the number of recipes is enormous, appropriate management is important.

In order to efficiently manage the recipe, it is important to commonize the recipe. The recipe related to wafer alignment can be commonized as long as the appearance of the alignment mark is similar. Generally, when the type name or the step name matches, alignment marks are often similar. However, it is not necessarily limited to this, and it is necessary to determine whether or not it is possible to commonize the alignment marks. In addition, the similarity with the template image in the recipe may decrease due to a temporal or sudden manufacturing process change, and it is important to manage the template image, the matching success and failure determination threshold value, and the image processing parameter set.

The invention relates to a sample observation apparatus and a sample observation method. The sample observation apparatus includes a unit that determines update necessity of a wafer alignment recipe, a unit that selects an item to be updated among a template image, a matching success and failure determination threshold value, or an image processing parameter in the wafer alignment recipe, and a unit that updates the wafer alignment recipe.

Further, the invention enables efficient management of the wafer alignment recipe by updating the wafer alignment recipe according to the selected item by using information on similarity distribution between the template image and an alignment mark image and information on similarity distribution between the template image and a non-alignment mark image to determine the update necessity of the wafer alignment recipe, to select the update item, and to update the recipe.

A wafer observation apparatus according to an aspect of the invention selects one or more items that need to be updated from the template image, the matching success and failure determination threshold value, or the image processing parameter set, and updates the recipe according to the selected item. By selecting one or more items that need to be updated from the template image, the matching success and failure determination threshold value, or the image processing parameter set, and updating the recipe according to the selected item, the recipe can be efficiently updated when a plurality of items are included in the wafer alignment recipe.

Hereinafter, embodiments of the invention will be described in detail with reference to the drawings. In all the drawings for explaining the embodiments, components having the same function are denoted by the same reference numerals, and a repetitive description thereof will be omitted in principle.

However, the invention should not be construed as being limited to description of the embodiments described below. Those skilled in the art should have easily understood that specific configurations can be changed without departing from the spirit or gist of the invention.

First Embodiment

The present embodiment relates to a method of creating a wafer alignment recipe, a method of determining update necessity of the recipe, a method of selecting an item to be updated among a template image, a matching success and failure determination threshold value, or an image processing parameter set in the recipe, a method of updating the recipe, and a method of observing a sample wafer. According to the present embodiment, it is possible to efficiently update a recipe when a plurality of items are included in the recipe.

FIG. 1 shows a configuration diagram of a wafer observation apparatus 100 according to the present embodiment. The wafer observation apparatus 100 according to the present embodiment includes a scanning electron microscope (SEM) 101 that captures an image, a control unit 102 that performs overall control, a storage unit 103 that stores information on a magnetic disk or a semiconductor memory, a calculation unit 104 that performs calculation according to a program, an external storage medium input and output unit 105 that inputs and outputs information to and from an external storage medium connected to the apparatus, a user interface unit 106 that controls input and output of information with a user, and a network interface unit 107 that communicates with other apparatuses via a network. An input and output terminal 113 including a keyboard, a mouse, a display, and the like is connected to the user interface unit 106.

The SEM 101 includes a movable stage 109 on which a sample wafer (semiconductor wafer) 108 is mounted, an electron source 110 that irradiates the sample wafer 108 with an electron beam 115, and a detector 111 that detects secondary electrons 116 and reflected electrons 117 generated from the sample wafer 108. The SEM 101 also includes an electron lens (not shown) that converges the electron beam 115 on the sample wafer 108, a deflector (not shown) that causes the sample wafer 108 to be scanned by the electron beam 115, and an imaging unit 112 that converts a signal from the detector 111 into a digital signal and generates a digital image. These components are connected to each other via a bus 114, and can exchange information with each other.

Figure 2:
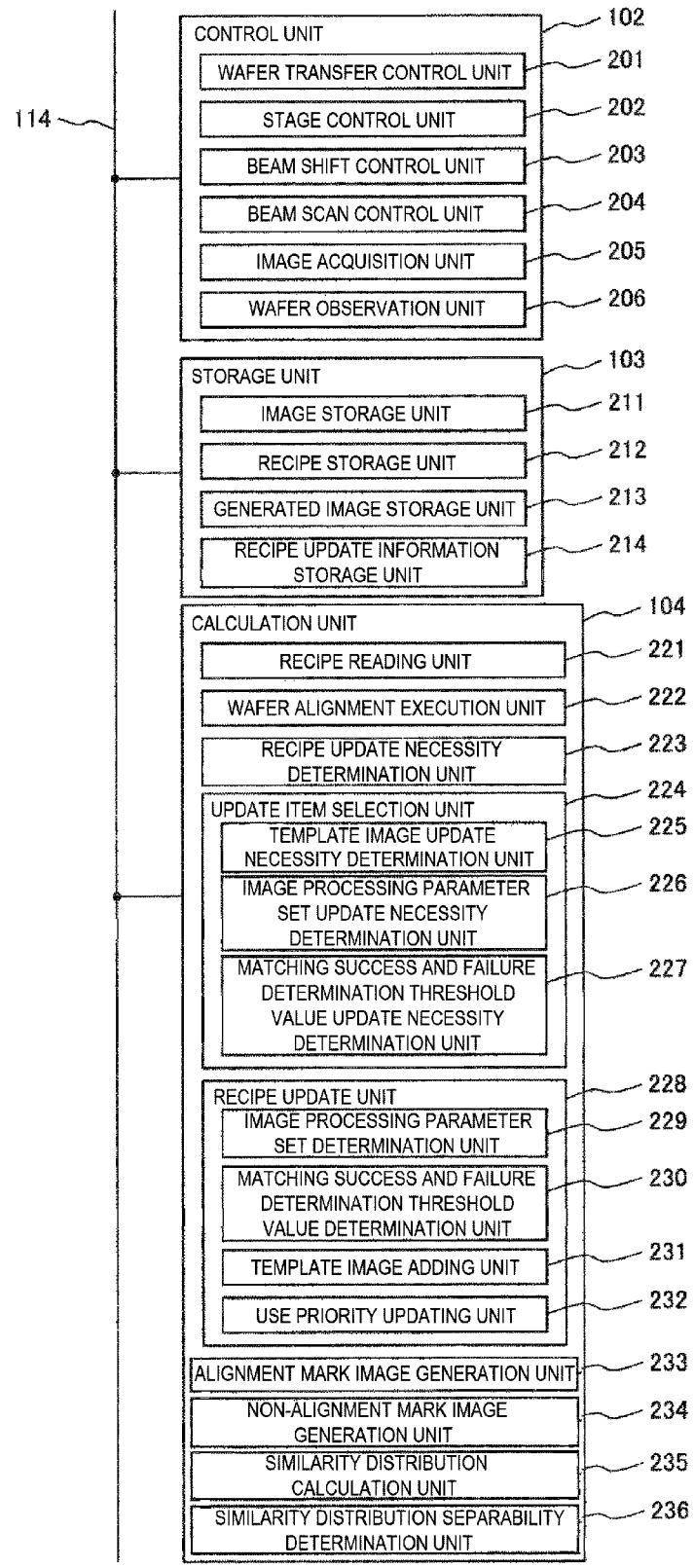
FIG. 2 is a block diagram showing a configuration of a control unit, a storage unit, and a calculation unit of the wafer observation apparatus according to the first to fourth embodiments of the invention.

FIG. 2 shows a configuration of the control unit 102, the storage unit 103, and the calculation unit 104.

The control unit 102 includes a wafer transfer control unit 201 that controls transfer of the sample wafer 108, a stage control unit 202 that controls the movable stage 109, a beam shift control unit 203 that controls an irradiation position of the electron beam 115 on the sample wafer 108, a beam scan control unit 204 that controls the scanning of the electron beam 115, an image acquisition unit 205, and a wafer observation unit 206 that observes the sample wafer 108.

The storage unit 103 includes an image storage unit 211 that stores an image of the sample wafer 108, a recipe storage unit 212 that stores a wafer alignment recipe, a generated image storage unit 213 that stores an image generated from the image of the sample wafer 108, and a recipe update information storage unit 214 that stores information related to recipe update.

The wafer alignment recipe stored in the recipe storage unit 212 includes capturing conditions (for example, an acceleration voltage, a probe current, an adding frame number, a size of capturing field of view), template image information (a template image, a matching success and failure determination threshold value, an image processing parameter set, a use priority), and the like.

The calculation unit 104 includes a recipe reading unit 221 that reads a wafer alignment recipe stored in the recipe storage unit 212, a wafer alignment execution unit 222 that calculates a rotation angle and a position deviation amount of the sample wafer 108 with respect to the movable stage 109, a recipe update necessity determination unit 223 that determines update necessity of the wafer alignment recipe stored in the recipe storage unit 212, an update item selection unit 224 that selects one or more items to be updated among the template image, the matching success and failure determination threshold value, or the image processing parameter set included in the wafer alignment recipe, a recipe updating unit 228 that updates the wafer alignment recipe, an alignment mark image generation unit 233 that generates an alignment mark image, a non-alignment mark image generation unit 234 that generates a non-alignment mark image, and a similarity distribution calculation unit 235 that calculates an alignment mark similarity distribution and a non-alignment mark similarity distribution.

The update item selection unit 224 includes a template image update necessity determination unit 225 that determines the update necessity of the template image included in the wafer alignment recipe, an image processing parameter set update necessity determination unit 226 that determines the update necessity of the image processing parameter set included in the wafer alignment recipe, and a matching success and failure determination threshold value update necessity determination unit 227 that determines the update necessity of the matching success and failure determination threshold value included in the wafer alignment recipe.

The recipe updating unit 228 includes an image processing parameter set determination unit 229 that determines a suitable image processing parameter set, a matching success and failure determination threshold value determination unit 230 that determines a suitable matching success and failure determination threshold value, a template image adding unit 231 that adds a template image to the wafer alignment recipe, and a use priority updating unit 232 that updates a use priority associated with the template image in the wafer alignment recipe. The recipe reading unit 221 to the similarity distribution calculation unit 235 may be configured as hardware designed to perform each calculation, or may be configured as software and executed using a general-purpose calculation apparatus (for example, CPU or GPU).

Next, a method of acquiring an image of coordinates designated using the image acquisition unit 205 will be described.

First, the sample wafer 108 to be measured is installed on the movable stage 109 using a robot arm (not shown) under the control of the wafer transfer control unit 201. Next, the movable stage 109 is moved under the control of the stage control unit 202 so that the capturing field of view of the sample wafer 108 is included in an irradiation range of the electron beam 115. At this time, in order to absorb a movement error of the movable stage 109, a position of the movable stage 109 is measured using a measurement unit (not shown), and a beam irradiation position is adjusted by the beam shift control unit 203 so as to cancel the movement error.

Next, the electron beam 115 from the electron source 110 is emitted onto the sample wafer 108 and scans the capturing field of view by the beam scan control unit 204. The secondary electrons 116 and the reflected electrons 117 generated from the sample wafer 108 by the irradiation of the electron beam 115 are detected by the detector 111, converted into a digital image by the imaging unit 112, and stored in the image storage unit 211.

As data of a wafer alignment recipe 300 stored in the recipe storage unit 212, a wafer alignment recipe for each type and step is stored. The wafer alignment recipe includes a type name, a step name, a recipe creation date and time, an image capturing condition, an alignment point number (NA), a recipe update necessity confirmation frequency (N), a similarity distribution standard deviation coefficient (a), a peripheral image capturing range (R) acquired at the time of recipe update necessity determination, template image information, a template image number (NT), a template image number upper limit (LT), and image processing parameter information.

The template image information included in the wafer alignment recipe includes information on one or more template images used for template matching, and each template image is associated with a template number, a template image file, a matching success and failure determination threshold value (TH), an image processing parameter set number, and a use priority for distinguishing the template image.

The use priority indicates an order of using the template image at the time of wafer alignment, and the smaller the value, the higher the priority is. It is also assumed that the image processing parameter set indicated by the image processing parameter set number associated with the template image is also associated with the template image.

The image processing parameter information included in the wafer alignment recipe includes information on parameter sets used when image processing is applied to an image, and a plurality of parameter sets are often prepared as parameter set candidates in advance.

For example, for each parameter set, the image processing parameter set number for distinguishing the parameter set (the same as the image processing parameter set number of the template image information), a filter type and a filter size to be applied to the image, binarization presence and absence information indicating whether to perform binarization after filter application, and a binarization threshold are associated. The filter type includes, for example, a Sobel filter, a Gaussian filter, an average value filter, and a bilateral filter.

Figure 3:
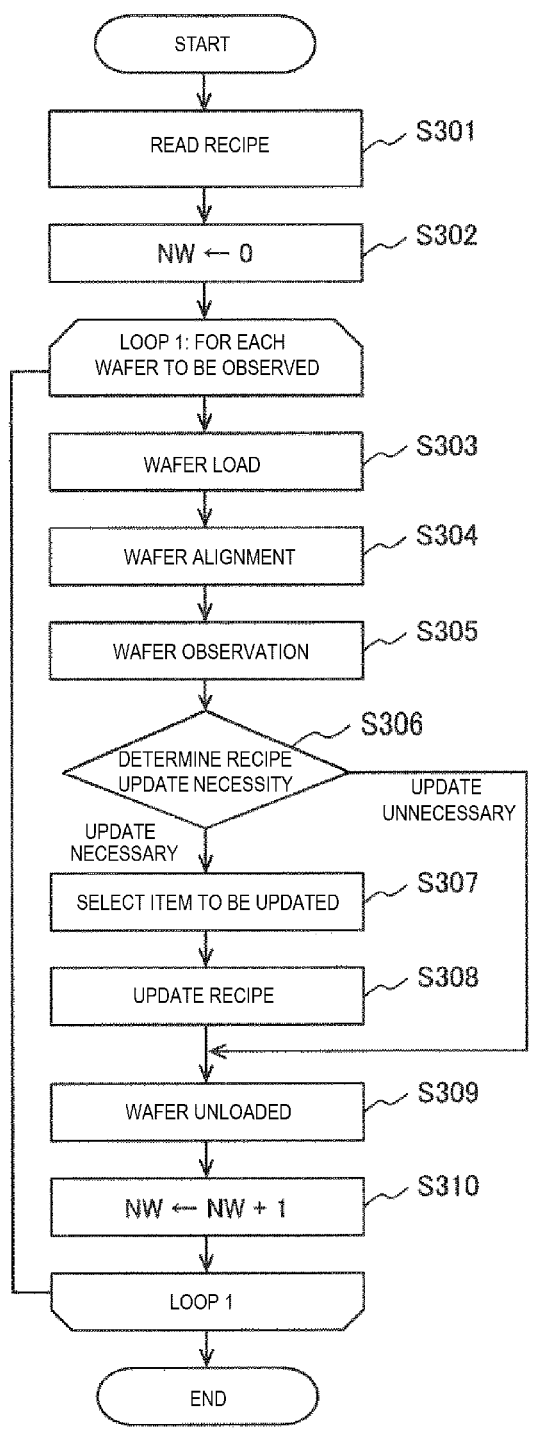
FIG. 3 is a flowchart showing a processing flow in a method of observing a sample wafer according to the first embodiment of the invention.

A method of observing the sample wafer 108 will be described with reference to FIG. 3.

First, the recipe reading unit 221 reads a wafer alignment recipe stored in the recipe storage unit 212 (S301), and sets an observed number NW of the sample wafer 108 of a type and step to be observed (hereinafter, referred to as an observation number) to 0 (S302).

Subsequently, the sample wafer 108 is loaded onto the movable stage 109 for each sample wafer 108 to be observed (S303). Next, the wafer alignment execution unit 222 calculates a rotation angle and a position deviation amount of the sample wafer 108 with respect to the movable stage 109, and performs wafer alignment by controlling the stage control unit 202 or the beam shift control unit 203 or the beam scan control unit 204 based on a calculation result (S304).

Next, the wafer observation unit 206 observes the sample wafer 108 (S305), and the recipe update necessity determination unit 223 determines update necessity of the wafer alignment recipe read in S301 (S306).

When it is determined in S306 that the wafer alignment recipe needs to be updated (update necessary), the update item selection unit 224 selects an item that needs to be updated (S307), and the recipe updating unit 228 updates the wafer alignment recipe (S308).

On the other hand, when it is determined in S306 that the wafer alignment recipe does not need to be updated (update unnecessary) or after the processing of S308 is executed, the sample wafer 108 is unloaded from the movable stage 109 (S309), and 1 is added to the observation number NW (S310). If the processing from S303 to S310 is executed on all sample wafers 108 to be observed, the observation of the sample wafer 108 is ended.

Figure 4:
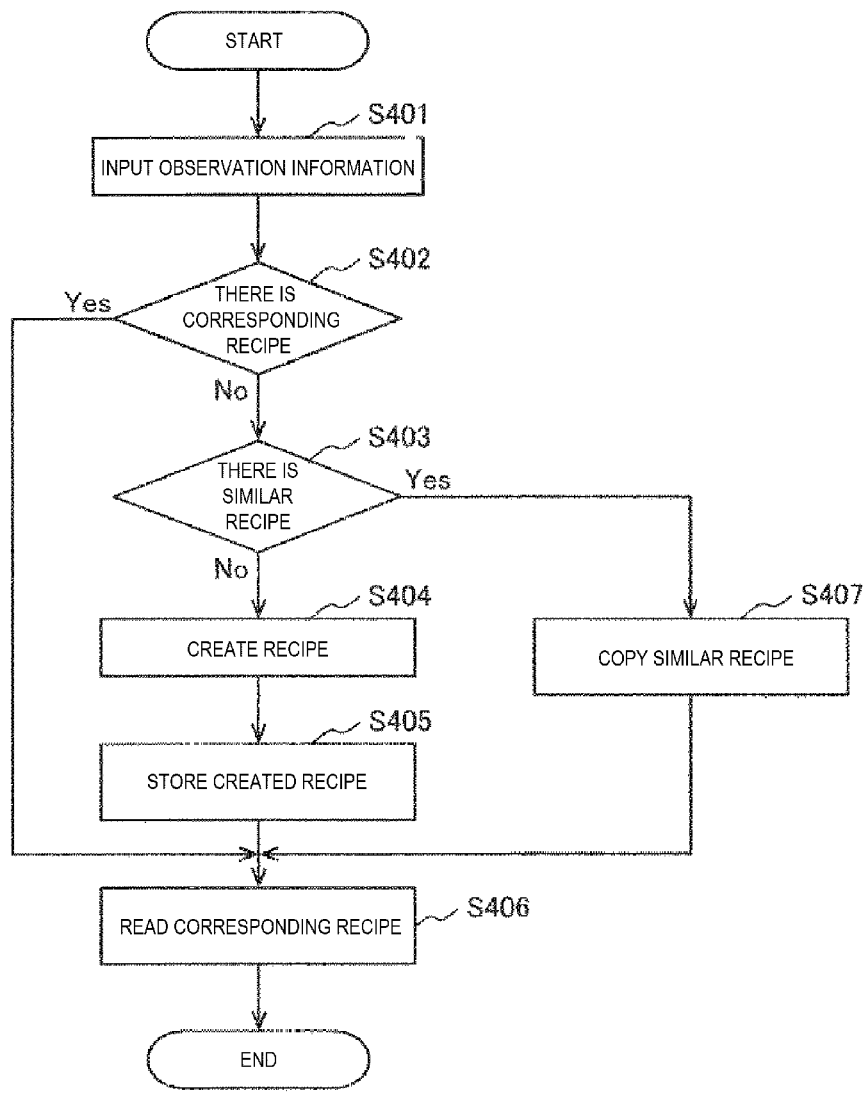
FIG. 4 is a flowchart showing a processing flow of a method of reading a wafer alignment recipe by a recipe reading unit of the wafer observation apparatus according to the first to fourth embodiments of the invention.

A method of reading the wafer alignment recipe in S301 will be described in detail with reference to FIG. 4.

First, the user inputs a type name and a step name as observation information of the sample wafer 108 (S401), and determines whether or not a recipe having the same type name of the observation information and the same step name of the observation information (hereinafter, referred to as a corresponding recipe) exists in the wafer alignment recipe stored in the recipe storage unit 212 (S402). When it is determined that the corresponding recipe exists in the recipe storage unit 212 (Yes in S402), the corresponding recipe is read (S406).

In the wafer alignment of the sample wafer 108, when the type name or the step name is the same, the wafer alignment recipe can often be used. In S402, when it is determined that the corresponding recipe does not exist in the recipe storage unit 212 (No in S402), it is determined whether or not a recipe having the same type name or the same step name of the observation information (hereinafter, referred to as similar recipe) exists in the wafer alignment recipe stored in the recipe storage unit 212 (S403).

When it is determined in S403 that no similar recipe exists in the recipe storage unit 212 (No in S403), a new recipe with the type name and the step name to be observed is created (S404), the created recipe is stored in the recipe storage unit 212 (S405), and a corresponding wafer alignment recipe is read from the recipe storage unit 212 (S406).

On the other hand, when it is determined in S403 that the similar recipe exists in the recipe storage unit 212 (Yes in S403), the similar recipe is copied to the recipe storage unit 212 as a recipe with the type name and the step name to be observed (S407), and a corresponding wafer alignment recipe is read from the recipe storage unit 212 (S406).

A method of creating the wafer alignment recipe (S404) will be described with reference to FIGS. 5 and 6.

At the time of recipe creation, first, the sample wafer 108 to be observed is loaded onto the movable stage 109 (S501). Next, an image including a unique pattern whose design position is known (hereinafter, referred to as an alignment mark) within the field of view is acquired (S502), a recipe creation screen is displayed, and information necessary for the recipe is input by the user (S503).

Figure 6:
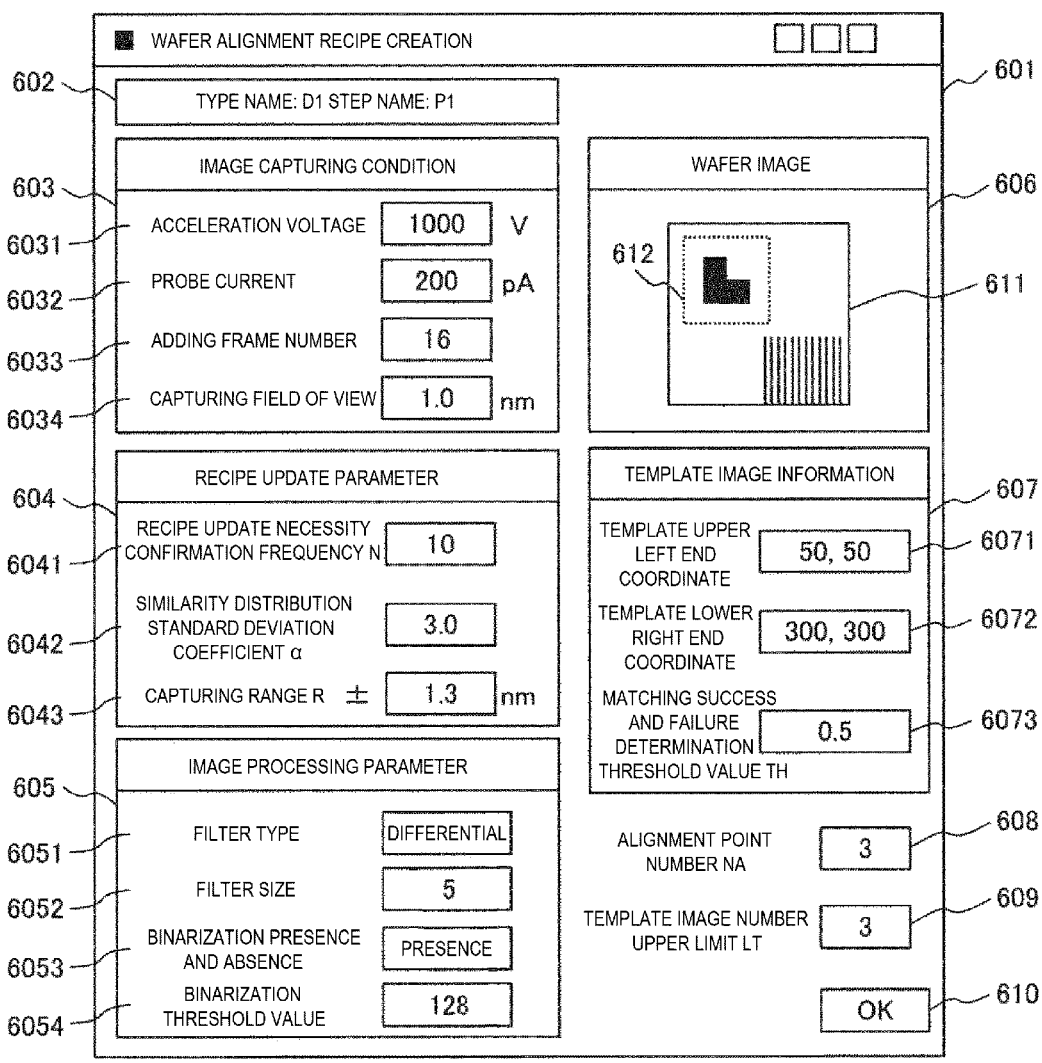
FIG. 6 is a front view of a display screen showing an example of a display screen of an input and output terminal at the time of creating the wafer alignment recipe according to the first embodiment of the invention.

FIG. 6 is a diagram showing an example of a recipe creation screen 601 of the input and output terminal 113 for the user to input the information necessary for the recipe in S503. The recipe creation screen 601 displays a type and step information display portion 602, an image capturing condition input portion 603, a recipe update parameter input portion 604, an image processing parameter input portion 605, a wafer image display portion 606, a template image information input portion 607, an alignment point number input portion 608, a template image number upper limit input portion 609, an OK button 610, and the like. An image 611 around an alignment mark portion is displayed on the wafer image display portion 606.

The user inputs an acceleration voltage 6031, a probe current 6032, an adding frame number 6033, and a capturing field of view 6034 when acquiring an image to the image capturing condition input portion 603. Further, the user inputs a recipe update necessity confirmation frequency N: 6041, a similarity distribution standard deviation coefficient α: 6042, and an image capturing range R: 6043 at the time of recipe update necessity determination to the recipe update parameter input portion 604. Further, the user inputs a filter type 6051 to be applied to the image, a filter size 6052, a binarization presence and absence 6053, and a binarization threshold value 6054 to the image processing parameter input portion 605.

The user further inputs a region to be a template image for template matching (template upper left end coordinate 6071 and template lower right end coordinate 6072) from the image 611 around the alignment mark portion displayed on the wafer image display portion 606 and a matching success and failure determination threshold value TH: 6073 for determining the success and failure of the template matching to the template image information input portion 607, inputs a point number NA: 608 used for wafer alignment to the alignment point number input portion 608, and inputs a template image number upper limit LT in the wafer alignment recipe to the template image number upper limit input portion 609. When the input is completed, the OK button 610 is clicked to execute the processing of S504 and thereafter.

When the region to be the template image is input in the template image information input portion 607, by dragging a region 612 in the image 611 around the alignment mark portion displayed on the wafer image display portion 606 and selecting the region 612, the region to be the template image may be designated without inputting numerical values in the template upper left end coordinate 6071 and the template lower right end coordinate 6072.

Further, regarding the image capturing range R: 6043 at the time of recipe update necessity determination in S306, instead of being input by the user in the recipe update parameter input portion 604, it may be determined in advance by taking into account at least one of a wafer installation error E1 that occurs when the sample wafer 108 is installed on the movable stage 109 and a stage movement error E2 that occurs when the movable stage 109 moves. When only the wafer installation error E1 is considered, E1 is set as a value R input to the capturing range R: 6043. When only the stage movement error E2 is considered, E2 is set as a value input in the capturing range R: 6043. When considering the wafer installation error E1 and the stage movement error E2, E1+E2 is set as a value input to the capturing range R: 6043.

Figure 5:
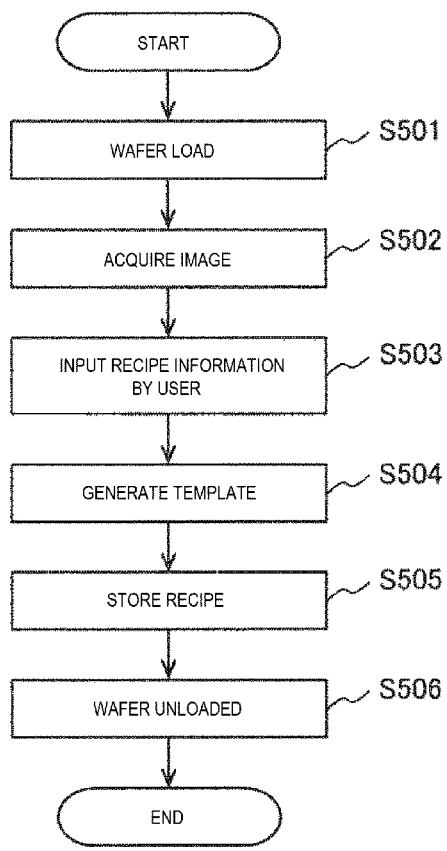
FIG. 5 is a flowchart showing a processing flow of a method of creating a wafer alignment recipe according to the first embodiment of the invention.

The description returns to FIG. 5. After executing the recipe information input processing by the user in S503, a template image is generated by being cut out from the image acquired in S502 based on the template upper left end coordinate 6071 and the template lower right end coordinate 6072 input by the user (S504), the information input by the user and the template image are stored in the recipe (S505), the sample wafer 108 is unloaded (S506), and the processing related to the recipe creation is ended.

The wafer alignment method in the wafer alignment (S304) will be described with reference to FIGS. 7 and 8.

Figure 7:
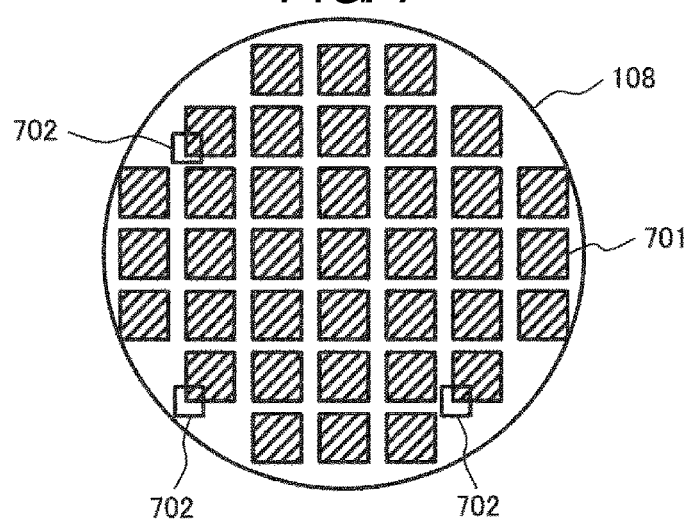
FIG. 7 is a diagram showing a relationship between a sample wafer and chips on the wafer according to the first embodiment of the invention.

FIG. 7 is a diagram showing a relationship between the sample wafer 108 and chips 701. A plurality of chips 701 are arranged on the sample wafer 108. In the wafer alignment step of S304, the alignment mark whose design position is known is detected only by the point number NA used for the wafer alignment (for example, 3 locations shown in regions 702 in FIG. 7), and a rotation angle and a position deviation amount of the wafer is calculated using the detected position information.

A detailed wafer alignment processing flow in the wafer alignment (S304) will be described with reference to FIG. 8.

First, AI representing an index of an alignment point is set to 1 (S801), and the movable stage 109 is moved so that the region 702 on the sample wafer 108 enters the capturing field of view obtained by the image acquisition unit 205 (S802). Next, the region 702 on the sample wafer 108 is captured using the image acquisition unit 205, and an alignment image is acquired (S803).

Next, TI representing an index of a template image is set to 1 (S804), and the alignment image acquired in S803 is input as a to-be-matched image together with a template image whose use priority in the template image information is TI, and template matching is performed (S805).

Figure 9:
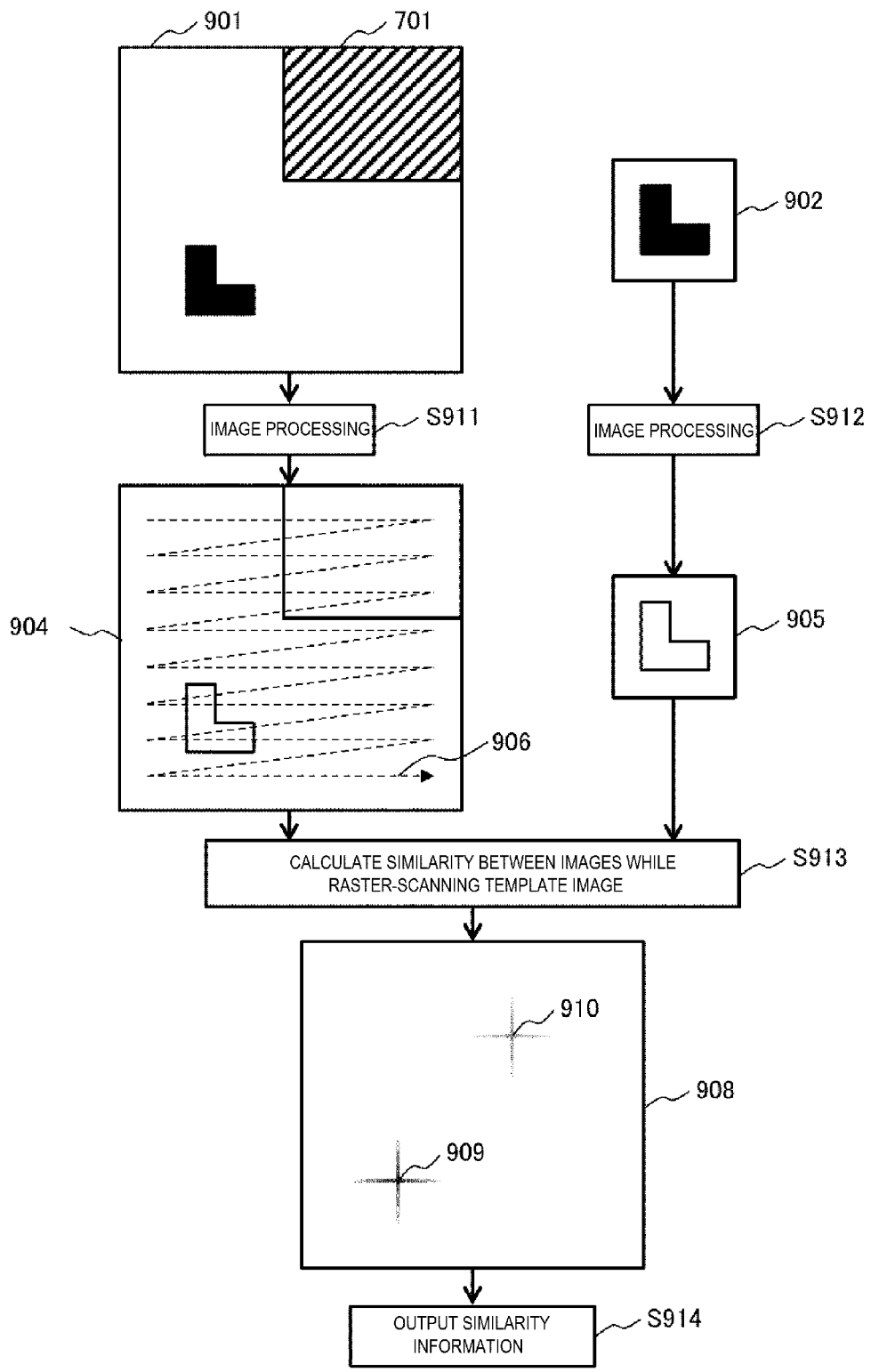
FIG. 9 is a flowchart showing a template matching processing flow according to the first embodiment of the invention.

FIG. 9 is a diagram showing a template matching method in the template matching in S805. In the template matching in S805, image processing (S911) is applied to an input to-be-matched image 901 using an image processing parameter set associated with an input template image 902, and a to-be-matched image 904 to which the image processing has been applied is obtained. Further, image processing (S912) is applied to the input template image 902, and a template image 905 to which image processing has been applied is obtained.

The template image 905 to which the image processing has been applied is overlapped on the to-be-matched image 904 to which the image processing has been applied while being shifted by a raster scan 906, a similarity between the images is calculated (S913), and a similarity image 908 having the similarity calculated in S913 as a pixel value is obtained. In the similarity image 908 of FIG. 9, locations (909, 910) having a high similarity are displayed in black.

Subsequently, in the similarity image 908, the locations 909 and 910 having higher similarity than the surroundings are output together with the similarity as detection position candidates (S914). For example, a normalized cross-correlation value may be used as the similarity. Further, a difference degree which increases as the difference between the images increases may be used instead of the similarity. In this case, a magnitude relationship is opposite to the similarity.

As an example of the data output in S914, a detection position candidate number, a detection candidate position, and information on the similarity at the detection candidate position are output for each detection position candidate.

Figure 8:
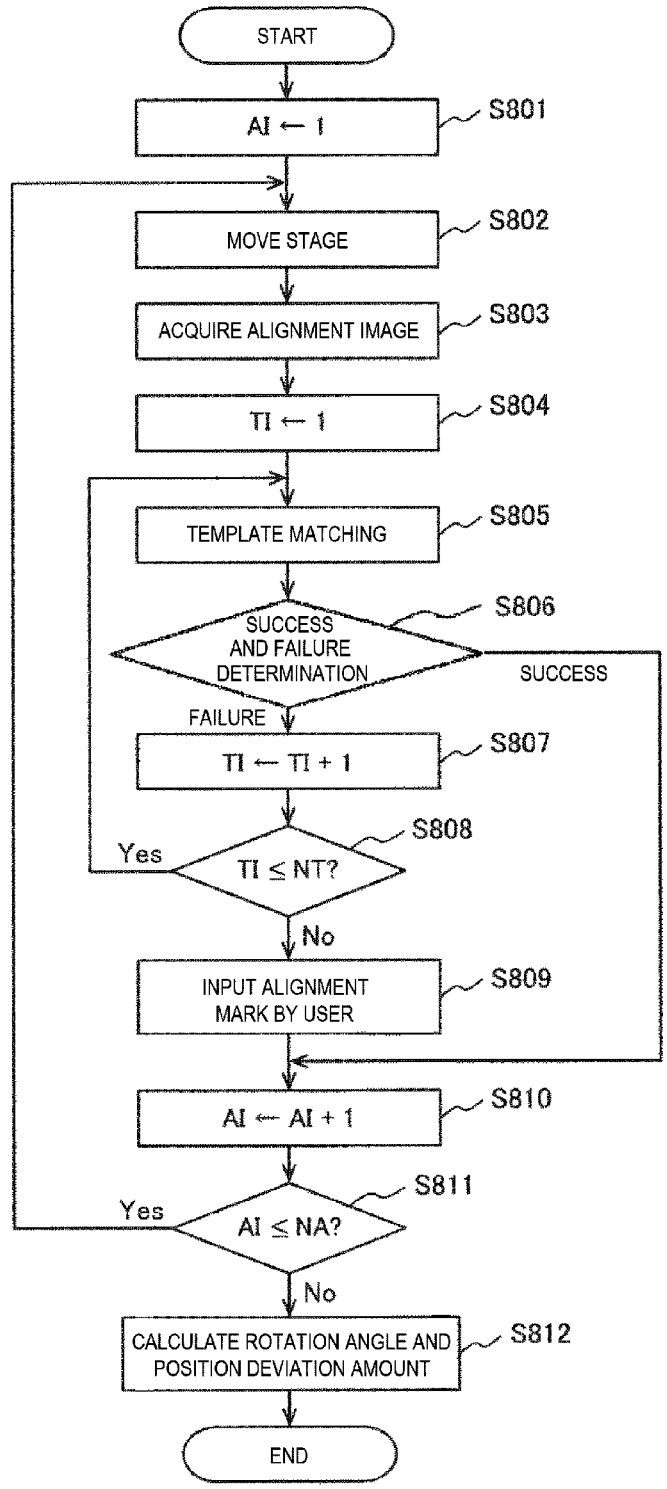
FIG. 8 is a flowchart showing a wafer alignment processing flow by a wafer alignment execution unit of the wafer observation apparatus according to the first to fourth embodiments of the invention.

The description returns to the processing flow shown in FIG. 8. When the similarity with the template image output by the template matching in S805 is low, there is a chance that the position of the alignment mark cannot be detected correctly. Therefore, in the wafer alignment in S304, after the template matching in S805, it is determined whether the template matching is successful (S806).

Specifically, in the template matching of S805, if a maximum value of the similarity between the detection candidate positions in the data output in S914 described in FIG. 9 is equal to or larger than the matching success and failure determination threshold value TH associated with the template image 902 used for the template matching, the template matching is determined as successful (success). If the maximum value of the similarity is less than the matching success and failure determination threshold value TH, the template matching is determined as failed.

When it is determined that the template matching failed in the success and failure determination (S806) (failure), 1 is added to TI (S807), and whether or not the TI is equal to or less than the template image number NT is confirmed (S808).

When TI is equal to or less than NT (Yes in S808), the processing returns to S805 to execute the processing again. On the other hand, when TI is larger than NT (No in S808), since it is considered difficult to detect the alignment mark even using any template image 902 included in the wafer alignment recipe, the user inputs a position of the alignment mark in the alignment image (S809), the position is set as a detection position, and the alignment image acquired in S803 is stored in the image storage unit 211 together with information on the detection position.

When it is determined that the template matching is successful in the success and failure determination (S806), or after the execution of the alignment mark position input by user (S809), 1 is added to the index AI of the alignment point (S810), and whether or not the AI is equal to or less than the alignment point number NA is confirmed (S811).

When the AI is equal to or less than the NA (Yes in S811), the processing is executed again from S802. On the other hand, when the AI is larger than the NA (No in S811), it is determined that the detection of the alignment mark at the alignment point number input in advance is ended, and the rotation angle and the position deviation amount of the sample wafer 108 with respect to the movable stage 109 is calculated using the information on the detection position (S812), and the wafer alignment (S304) in the processing flowchart shown in FIG. 3 is ended.

As an example of a wafer alignment result associated with the alignment image stored in the image storage unit 211 after the wafer alignment (S304) is executed, for each alignment image, an alignment point number for distinguishing alignment points, alignment mark position information on the alignment image detected by S805 or S809, and an acquisition position of the alignment image on the wafer are associated.

A wafer installation error occurs when the sample wafer 108 is loaded on the movable stage 109, and a stage movement error occurs when the movable stage 109 moves. In the wafer alignment (S304), regardless of the magnitude of an error, it is necessary to detect the alignment mark regardless of what pattern other than the alignment mark (hereinafter, referred to as the non-alignment mark) is included in the alignment image. However, when it is difficult to detect the alignment mark due to a change in a manufacturing process or a difference in manufacturing type and step, it is necessary to update the wafer alignment recipe stored in the recipe storage unit 212.

Using at least one of the wafer installation error, the stage movement error, and input information by the user, an image around the alignment mark (hereinafter, referred to as a peripheral image) is obtained within a range that may be included in the field of view at the time of wafer alignment. Using the peripheral image, it is determined whether the alignment mark can be detected even if any non-alignment mark is included, and update necessity determination of the wafer alignment recipe stored in the recipe storage unit 212 is performed (S306).

Details of a method of determining the update necessity of the wafer alignment recipe in S306 will be described with reference to FIG. 10. First, it is determined whether or not an observation number NW is an integral multiple of a predetermined number N (NW/N=i:N is a recipe update necessity confirmation frequency, i is an integer) (S1001). When it is determined in S1001 that the observation number is the integral multiple of the predetermined number N (Yes in S1001), a peripheral image is acquired within a range indicated by the capturing range R: 6043 in the recipe creation screen 601 in FIG. 6 centering on the detection position of the alignment mark in the alignment image acquired in S803 (S1002).

Figure 11:
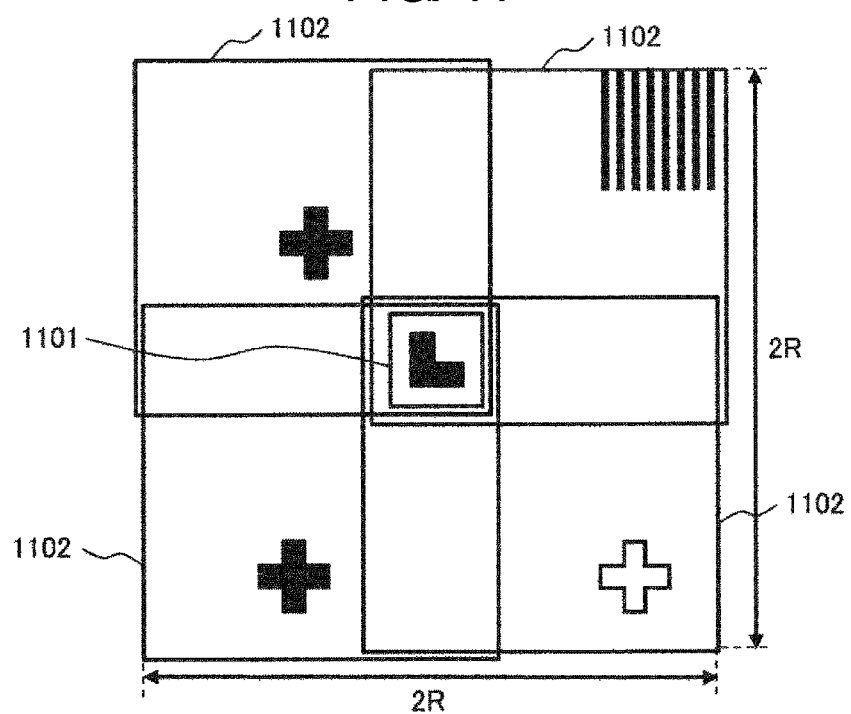
FIG. 11 is a diagram showing an acquisition range of a region around an alignment mark and a peripheral image according to the first embodiment of the invention.

A peripheral image acquisition method in S1002 will be described with reference to FIG. 11. FIG. 11 is a diagram showing a region around the alignment mark. When an alignment mark detection position detected in the wafer alignment (S304) is set as 1101, the stage movement and the image acquisition are repeated within a range of 2R×2R centering on the alignment mark detection position 1101 to acquire a peripheral image 1102. In the example in FIG. 11, four peripheral images are acquired, and any number of images may be acquired as long as an image in the range of 2R×2R centering on the alignment mark detection position 1101 is acquired. Although the method of acquiring the peripheral image at one location on the wafer is described in FIG. 11, the peripheral image may be acquired at a plurality of locations on the wafer, for example, three locations shown in the regions 702 in FIG. 7.

Figure 10:
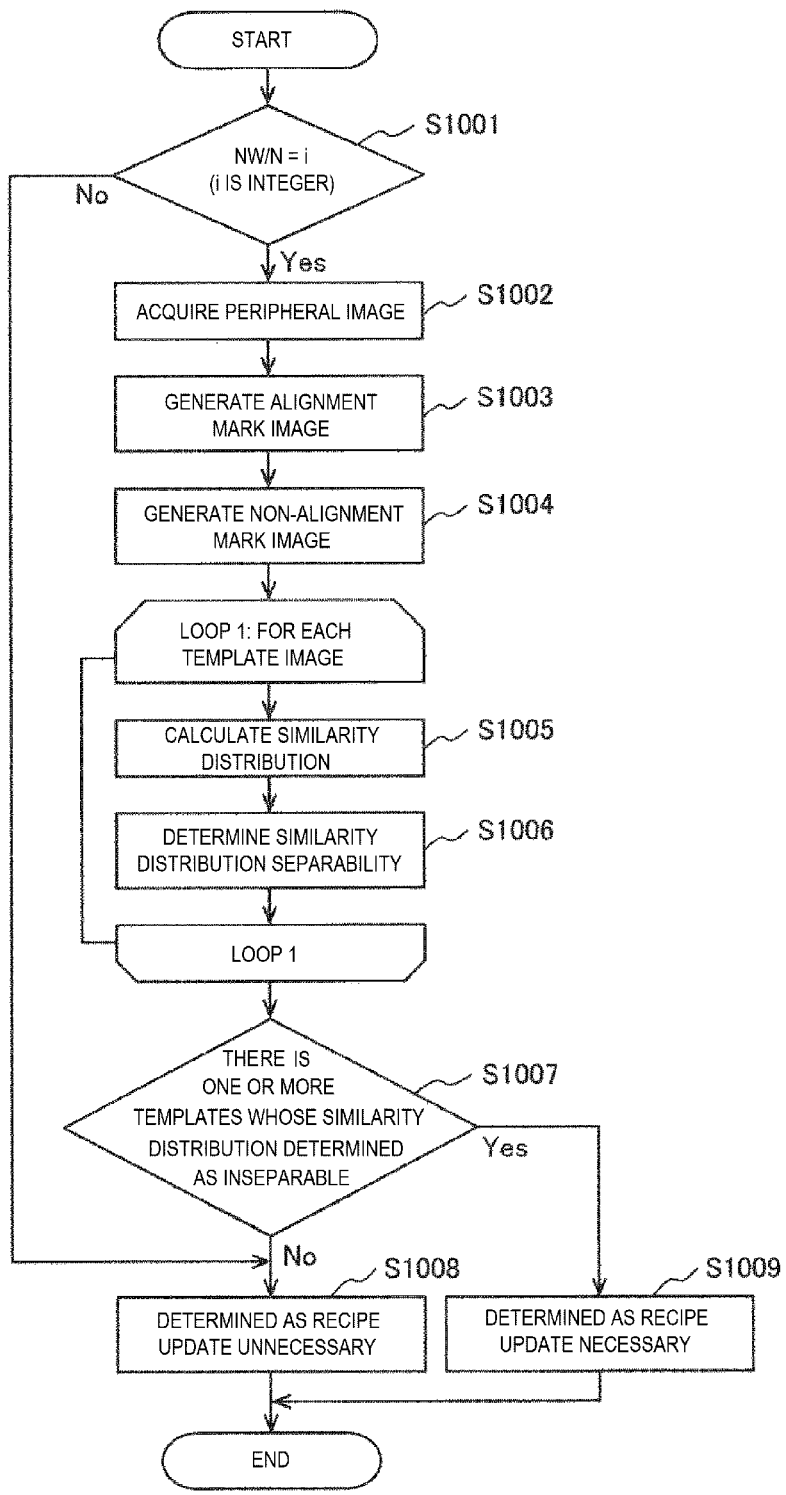
FIG. 10 is a flowchart showing a processing flow of a method of determining update necessity of the wafer alignment recipe by a recipe update necessity determination unit of the wafer observation apparatus according to the first and second embodiments of the invention.

The description will be returned to FIG. 10. After executing the peripheral image acquisition step (S1002), the alignment mark image generation unit 233 is used to generate an alignment mark image based on the peripheral image (S1003), and the non-alignment mark image generation unit 234 is used to generate a non-alignment mark image based on the peripheral image (S1004). The generated alignment mark image and non-alignment mark image are stored in the generated image storage unit 213.

Figure 12:
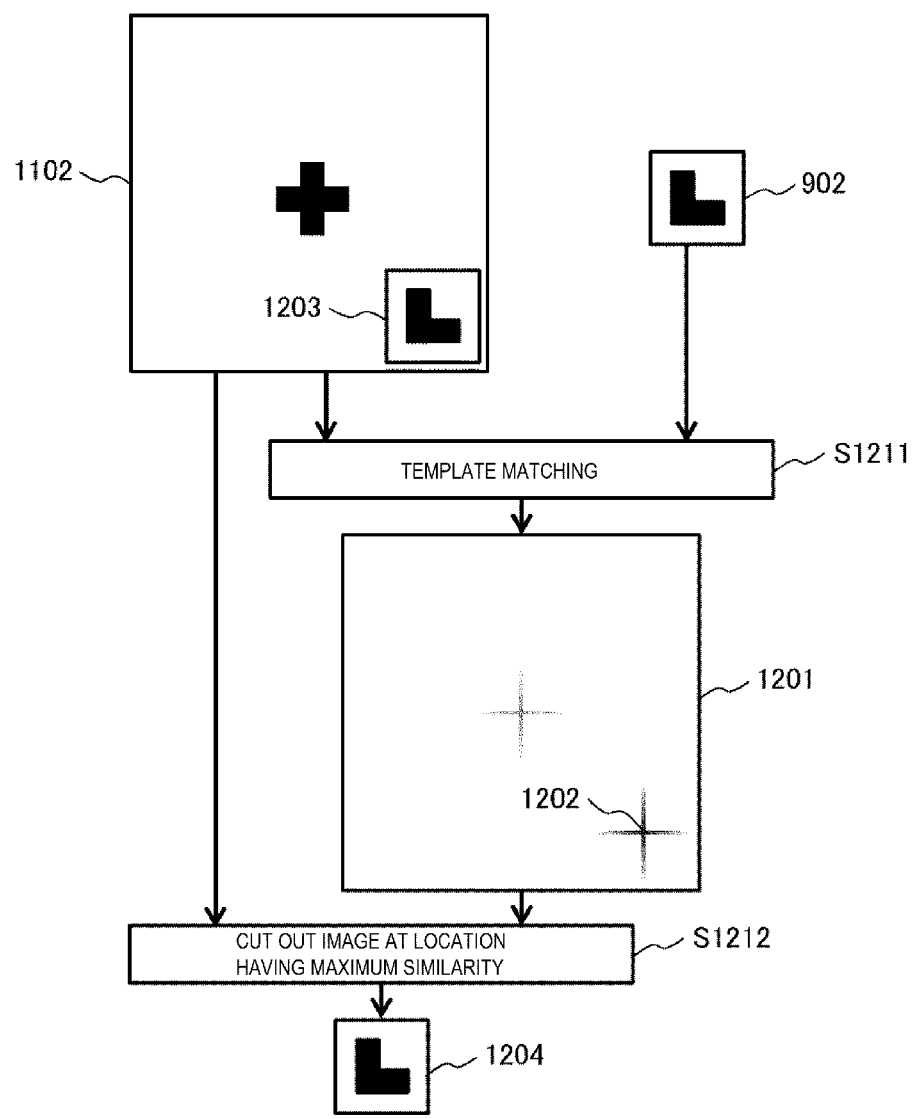
FIG. 12 is a flowchart showing a processing flow of a method of generating an alignment mark image by an alignment mark image generation unit of the wafer observation apparatus according to the first to fourth embodiments of the invention.

A method of generating the alignment mark image in the alignment mark image generation step (S1003) will be described with reference to FIG. 12.

First, the template matching is performed using the template image 902 and the peripheral image 1102 acquired in the peripheral image acquisition step (S1002) as a to-be-matched image (S1211), and a similarity image 1201 is obtained. Next, an image of a region 1203 corresponding to a location 1202 having a maximum similarity in the similarity image 1201 is cut out (S1212) in the peripheral image 1102, and an alignment mark image 1204 is obtained.

Although the method of generating the alignment mark image 1204 using the peripheral image 1102 is described in FIG. 12, instead of the peripheral image 1102, an alignment mark image may be generated using the alignment image acquired in the alignment image acquisition step (S803) described with reference to FIG. 8. When using the alignment image acquired in the alignment image acquisition step (S803), without performing the template matching step (S1211), a region indicated by the alignment mark position detected during wafer alignment in the wafer alignment step (S304) may be cut out from the alignment image and used as the alignment mark image.

Next, a method of generating the non-alignment mark image in the non-alignment mark image generation step (S1004) will be described with reference to FIG. 13.

First, the template matching is performed using the template image 902 and the peripheral image 1102 acquired in the peripheral image acquisition step (S1002) as a to-be-matched image (S1311), and a similarity image 1301 is obtained. Next, in the peripheral image 1102, an image of a region 1304 corresponding to a location 1303 having a similarity higher than the periphery except for a location 1302 where the similarity is the maximum is cut out in the similarity image 1301 (S1312), and a non-alignment mark image 1305 is obtained.

Although the method of performing the template matching (S1311) using the peripheral image 1102 and the template image 902 to generate the non-alignment mark image 1305 is described in FIG. 13, the non-alignment mark image may be generated using the similarity image 1201 calculated in the template matching step (S1211) described with reference to FIG. 12.

Figure 13:
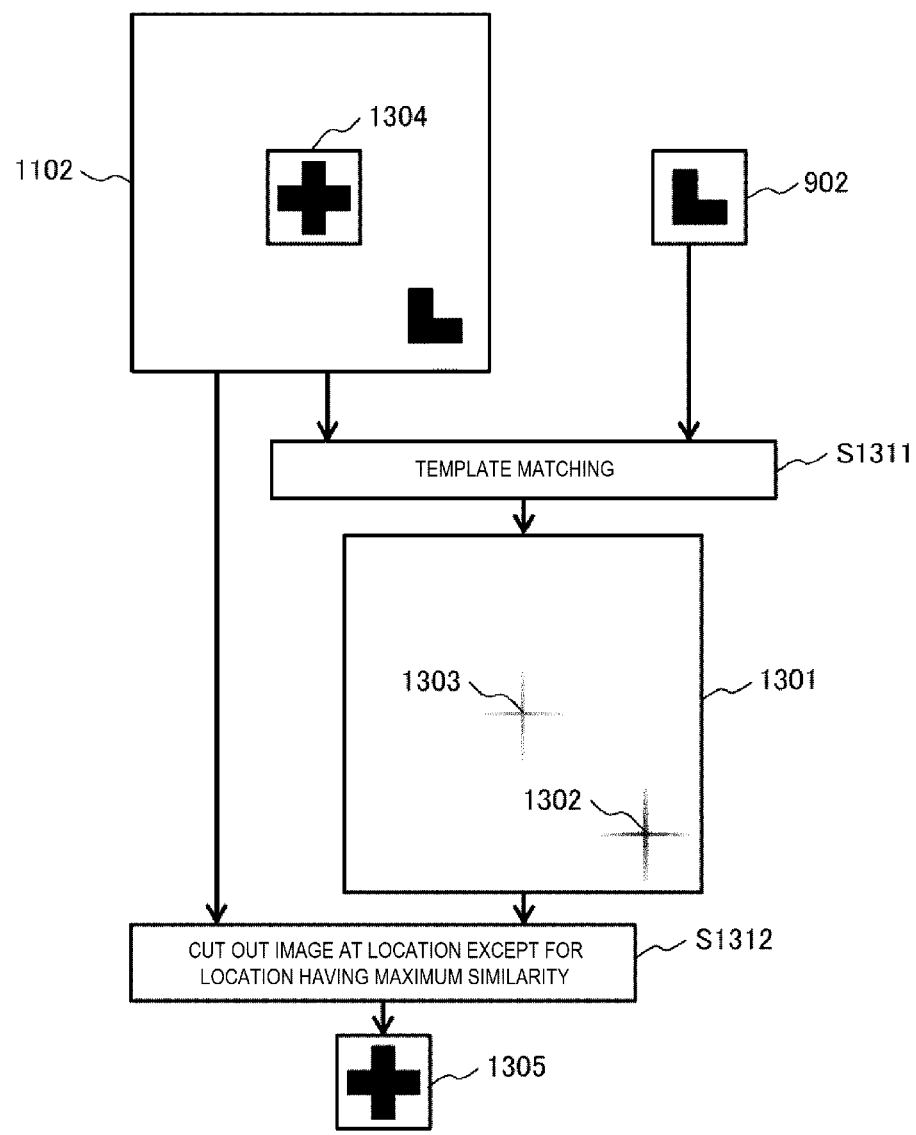
FIG. 13 is a flowchart showing a processing flow of a method of generating a non-alignment mark image by a non-alignment mark image generation unit of the wafer observation apparatus according to the first to fourth embodiments of the invention.

Using the method described in FIG. 13, non-alignment mark images are generated from all peripheral images acquired in the peripheral image acquisition step (S1002), and one or more non-alignment mark images are obtained.

After performing the alignment mark image generation step (S1003) and the non-alignment mark image generation step (S1004), as information associated with the alignment mark image and the non-alignment mark image stored in the generated image storage unit 213, a generated image number and an attribute indicating the alignment mark image or the non-alignment mark image are stored for each of the generated alignment mark image and the non-alignment mark image.

The description will be returned to FIG. 10. After performing the non-alignment mark image generation step (S1004), in a similarity distribution calculation step (S1005), for each template image T included in the recipe, the similarity distribution calculation unit 235 calculates an alignment mark similarity distribution and a non-alignment mark similarity distribution by receiving the template image T and an image processing parameter set associated with the template image T as input.

Next, using the alignment mark similarity distribution, the non-alignment mark similarity distribution and the matching success and failure determination threshold value TH, separability of similarity distribution between the alignment mark similarity distribution and the non-alignment mark similarity distribution calculated in the similarity distribution calculation step (S1005) is determined (S1006).

Details of the method of calculating the alignment mark similarity distribution and the non-alignment mark similarity distribution in the similarity distribution calculation step (S1005) will be described with reference to the flowchart of FIG. 14.

First, image processing is applied to the input template image and the alignment mark image stored in the generated image storage unit 213 using the input image processing parameter set (S1401). Subsequently, for each alignment mark image to which the image processing has been applied, the similarity with the template image to which the image processing is applied is calculated (S1402).

After that, an average value M1 and a standard deviation σ1 of the calculated one or more similarities are calculated (S1403), and a normal distribution having the average value M1 and the standard deviation σ1 is defined as a similarity distribution between the template image and the alignment mark image (hereinafter, referred to as alignment mark similarity distribution). Subsequently, the image processing is applied to the input template image and the non-alignment mark image stored in the generated image storage unit 213 using the input image processing parameter set (S1404), and for each non-alignment mark image to which the image processing has been applied, the similarity with the template image to which the image processing is applied is calculated (S1405).

After that, an average value M2 and a standard deviation σ2 of the calculated one or more similarities are calculated (S1406), and a normal distribution having the average value M2 and the standard deviation σ2 is defined as a similarity distribution between the template image and the non-alignment mark image (hereinafter, referred to as non-alignment mark similarity distribution).

Figure 15:
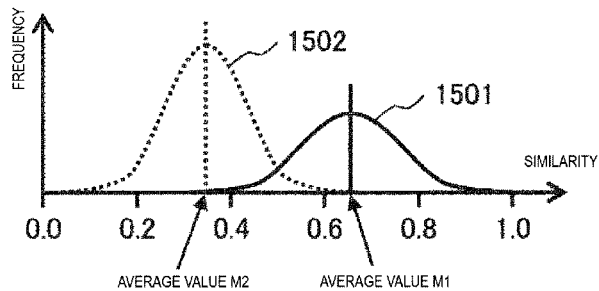
FIG. 15 is a graph showing the similarity distribution calculated using the similarity distribution calculation unit according to the first to fourth embodiments of the invention.

FIG. 15 is a graph showing the similarity distribution calculated through the processing from S1401 to S1406 in the similarity distribution calculation unit 235. A horizontal axis represents the similarity and a vertical axis represents a frequency. In the graph of FIG. 15, an alignment mark similarity distribution 1501 and the average value M1 thereof, and a non-alignment mark similarity distribution 1502 and the average value M2 thereof are shown.

Figure 21:
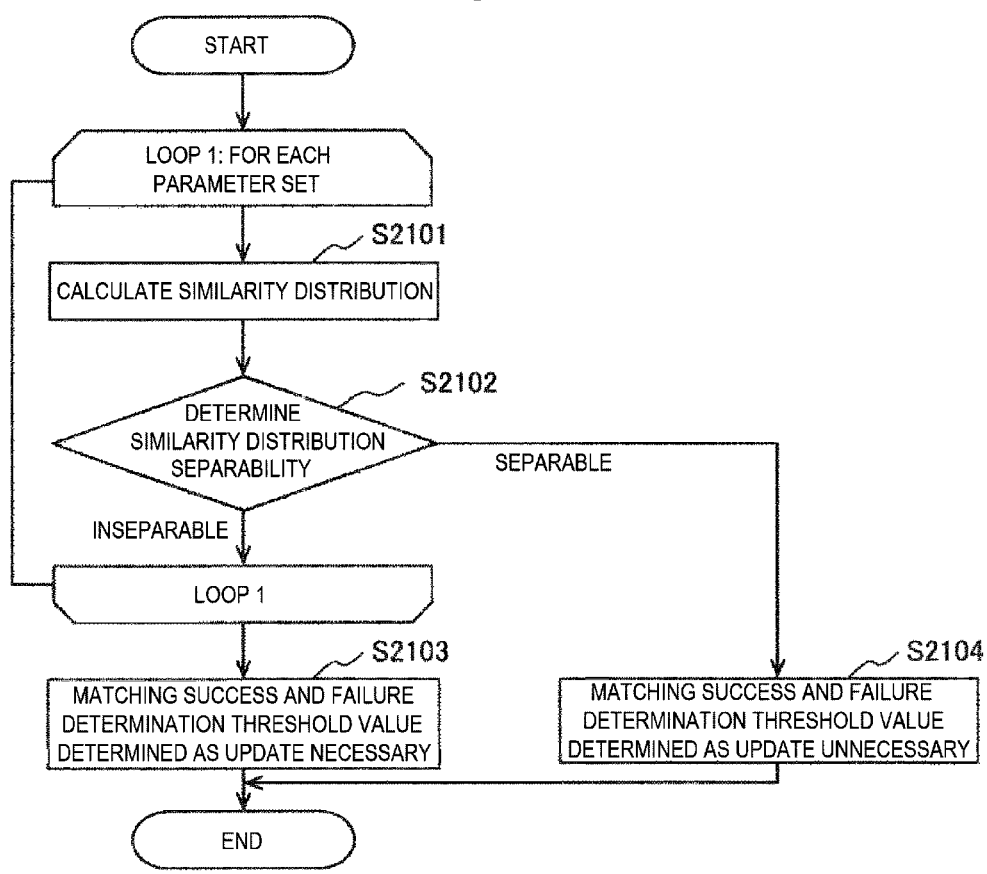
FIG. 21 is a flowchart showing a processing flow of a method of determining update necessity of a matching success and failure determination threshold value by a matching success and failure determination threshold value necessity determination unit of the wafer observation apparatus according to the first to fourth embodiments of the invention.

Next, a method of determining the separability of the alignment mark similarity distribution and the non-alignment mark similarity distribution in the similarity distribution separability determination step (S1006) shown in FIG. 21 will be described. A similarity distribution separability determination unit 236 determines the separability of the similarity distribution by whether the alignment mark similarity distribution and the non-alignment mark similarity distribution can be separated by the matching success and failure determination threshold value TH.

Figure 16:
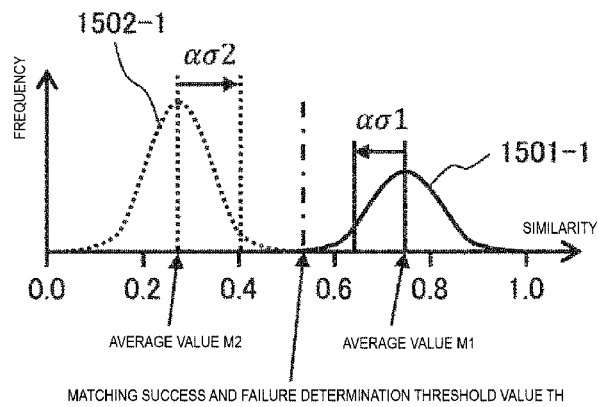
FIG. 16 is a graph showing an example of separable alignment mark similarity distribution and non-alignment mark similarity distribution according to the first to fourth embodiments of the invention.

Specifically, in the similarity distribution separability determination unit 236, (M1−α×σ1) is set as a lower limit of the alignment mark similarity distribution, and (M2+α×σ2) is set as an upper limit of the non-alignment mark similarity distribution. As shown in FIG. 16, if the (M1−α×σ1) in an alignment mark similarity distribution 1501-1 is equal to or larger than the matching success and failure determination threshold value TH, and the (M2+α×σ2) in a non-alignment mark similarity distribution 1502-1 is equal to or less than the matching success and failure determination threshold value TH, the two similarities can be determined as separable.

Figure 17:
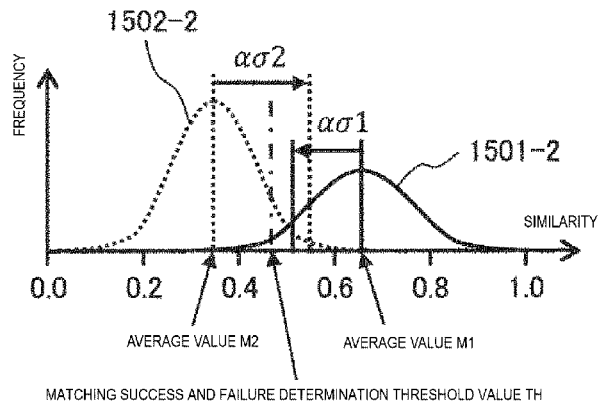
FIG. 17 is a graph showing an example of inseparable alignment mark similarity distribution and non-alignment mark similarity distribution according to the first to fourth embodiments of the invention.

On the other hand, as shown in FIG. 17, if a relationship between an alignment mark similarity distribution 1501-2 and a non-alignment mark similarity distribution 1502-2 is other than the relationship shown in FIG. 16, it is determined as inseparable.

After that, a determination result of the similarity distribution separability determination step (S1006) by the similarity distribution separability determination unit 236 is stored in the recipe update information storage unit 214.

In the recipe update information stored in the recipe update information storage unit 214 after executing S1005 to S1006 for all template images included in the recipe, a template number, the similarity distribution separability (separability determination result) of the similarity distribution in the similarity distribution separability determination step (S1006), and an update item to be updated when the similarity distributions are inseparable are stored for each template image.

The description will be returned to FIG. 10. After performing the similarity distribution calculation step (S1005) and the similarity distribution separability determination step (S1006) for all template images included in the wafer alignment recipe, whether or not the template image whose similarity distribution is inseparable exists is confirmed using the recipe update information stored in the recipe update information storage unit 214 (S1007).

As a result of the confirmation in S1007, when at least one template image whose similarity distribution is inseparable exists (Yes in S1007), it is determined that the wafer alignment recipe needs to be updated (S1009).

On the other hand, as a result of the confirmation in S1007, when the template image corresponding to the condition that the similarity distribution is inseparable does not exist (No in S1007), that is, when the similarity distribution of all template images included in the recipe is determined as separable, it is determined that the recipe does not need to be updated (S1008). When it is determined in S1001 that the observation number NW is not an integral multiple of the predetermined number N (No in S1001), the processing moves to S1008 to determine that the recipe does not need to be updated.

Figure 18:
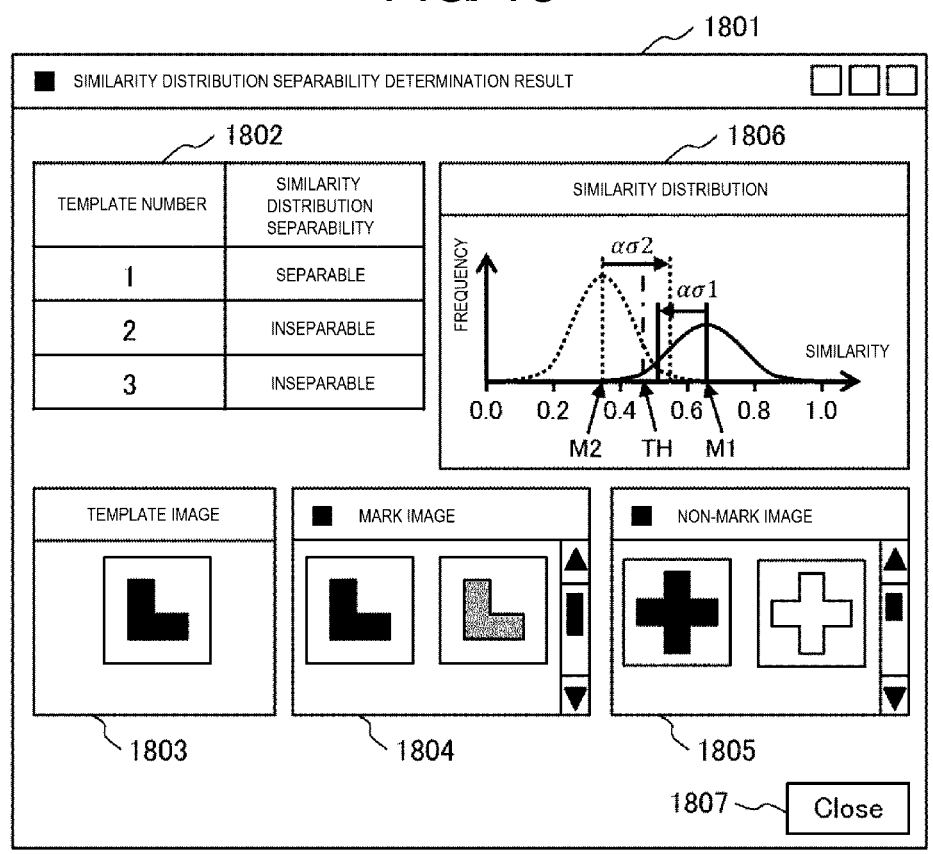
FIG. 18 is a front view of a display screen showing an example of a screen of an input and output terminal displaying a separability determination result of the alignment mark similarity distribution and the non-alignment similarity distribution according to the first embodiment of the invention.

When it is determined that the wafer alignment recipe needs to be updated (S1009), as shown in FIG. 18, a similarity distribution separability determination result screen 1801 for each template image is displayed on the input and output terminal 113 so that the user can confirm the similarity distribution separability determination result.

On the similarity distribution separability determination result screen 1801 displayed on the input and output terminal 113 shown in FIG. 18, a result display portion 1802, a template image display portion 1803, an alignment mark image 1804, a non-alignment mark image display portion 1805, a similarity distribution display portion 1806 and a Close button 1807 are displayed.

When a template number displayed on the result display portion 1802 is selected, a template image corresponding to the selected template number is displayed on the template image display portion 1803, an alignment mark image is displayed on the alignment mark image display portion 1804, a non-alignment mark image is displayed on the non-alignment mark image display portion 1805, and a relationship between the similarity distribution, the average values M1 and M2, and the matching success and failure determination threshold value TH is displayed on the similarity distribution display portion 1806.

When the user clicks the Close button 1807 after confirming the similarity distribution on the similarity distribution separability determination result screen 1801, a similarity distribution separability determination result screen 2501 is closed, and the subsequent processing is executed.

Next, details of the update item selection method in the update item selection step (S307) in the flowchart of FIG. 3 will be described with reference to the flowchart of FIG. 19.

In the update item selection step (S307), first, the template image update necessity determination unit 225 determines the update necessity of the template image T (S1901). When it is determined in S1901 that the template image T needs to be updated, the template image is selected as an update item (S1902).

On the other hand, when it is determined that the template image T does not need to be updated in the template image update necessity determination step (S1901), the update necessity of the image processing parameter set is determined by the image processing parameter set update necessity determination unit 226 (S1903). When it is determined in S1903 that the image processing parameter set needs to be updated (update necessary), the image processing parameter set is selected as an update item (S1904).

On the other hand, when it is determined in S1903 that the image processing parameter set does not need to be updated (update unnecessary) or after it is determined in S1903 that the image processing parameter set needs to be updated and the image processing parameter set is selected as the update item in S1904, the update necessity of the matching success and failure determination threshold value is determined by the matching success and failure determination threshold value update necessity determination unit 227 (S1905).

When it is determined in S1905 that the matching success and failure determination threshold value needs to be updated (update necessary), the matching success and failure determination threshold value is selected as an update item (S1906).

After execution of S1902, or when it is determined in S1905 that the matching success and failure determination threshold value does not need to be updated (update unnecessary), or, after the execution of S1906, when the processing from S1901 to S1906 is executed for all template images included in the recipe, the selection of the update item is ended.

Figure 20:
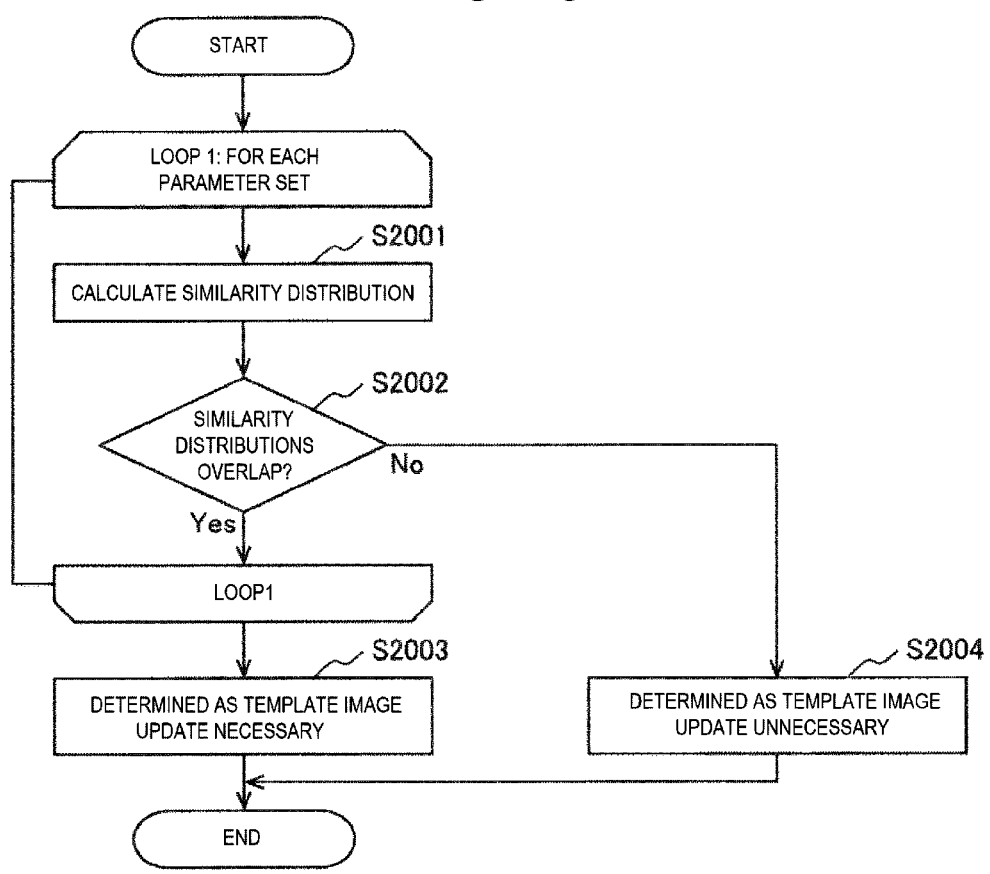
FIG. 20 is a flowchart showing a processing flow of a method of determining update necessity of a template image by a template image update necessity determination unit of the wafer observation apparatus according to the first to fourth embodiments of the invention.

A method of determining the update necessity of the template image T in the template image update necessity determination step (S1901) will be described with reference to the flowchart of FIG. 20. When determining the update necessity of the template image T, an image processing parameter set is searched from image processing parameter sets included in image processing parameter information 312 such that an alignment mark similarity distribution 2101 and a non-alignment mark similarity distribution 2102 do not overlap.

Specifically, for each image processing parameter set P, the alignment mark similarity distribution 1501 and the non-alignment mark similarity distribution 1502 are calculated by the similarity distribution calculation unit 235 using the image processing parameter set P and the template image T as input (S2001: the same as S1005).

Next, it is determined whether or not the alignment mark similarity distribution 1501 calculated in the similarity distribution calculation step (S2001) overlaps the non-alignment mark similarity distribution 1502 (S2002). In S2002, if the lower limit (M1−α×σ1) of the alignment mark similarity distribution 1501 is equal to or larger than the upper limit (M2+α×σ2) of the non-alignment mark similarity distribution 1502, it is determined that the two similarity distributions do not overlap (No in S2002). In other cases, that is, when (M1−α×σ1) is less than (M2+α×σ2), it is determined that the two similarity distributions overlap (Yes in S2002).

For all image processing parameter sets included in the image processing parameter information 312, when it is determined in S2002 that the two similarity distributions overlap (Yes in S2002), it is determined that it is difficult to separate the similarity distributions using any image processing parameter set, and it is determined that the template image needs to be updated (S2003). When it is determined in S2002 that the two similarity distributions do not overlap (No in S2002), it is determined that the template image T does not need to be updated (S2004).

Next, returning to the flowchart of FIG. 19, the method of determining the update necessity of the image processing parameter set in the image processing parameter set update necessity determination step (S1903) will be described.

In the image processing parameter set update necessity determination step (S1903), the similarity distribution calculation unit 235 receives the template image T and the image processing parameter set associated with the template image T as input, and calculates the alignment mark similarity distribution 1501 and the non-alignment mark similarity distribution 1502 in the same manner as described in S2001.

Next, in the same manner as described in S2002, it is determined whether or not the calculated alignment mark similarity distribution 1501 overlaps the non-alignment mark similarity distribution 1502. As a result, when it is determined that the two similarity distributions overlap (Yes in S2002), it is determined that the image processing parameter set needs to be updated. When it is determined that the two similarity distributions do not overlap (No in S2002), it is determined that the image processing parameter set does not need to be updated.

Returning to the flowchart of FIG. 19, the method of determining the update necessity of the matching success and failure determination threshold value in the matching success and failure determination threshold value update necessity determination step (S1905) will be described with reference to FIG. 21. In the matching success and failure determination threshold value determination step (S1905), similar to the similarity distribution calculation step (S2001) in the template image update necessity determination step (S1901), for each image processing parameter set P, the similarity distribution calculation unit 235 receives the image processing parameter set P and the template image T as input, and calculates the alignment mark similarity distribution 1501 and the non-alignment mark similarity distribution 1502 (S2101).

Next, similar to the similarity distribution separability determination step (S1006) described in detail with reference to FIG. 14, it is determined whether the alignment mark similarity distribution 1501 and the non-alignment mark similarity distribution 1502 can be separated by the matching success and failure determination threshold value TH associated with the template image (S2102).

For all image processing parameter sets included in the image processing parameter information, when it is determined in S2102 that the two similarity distributions cannot be separated (inseparable), it is determined that it is difficult to separate the similarity distributions by using any image processing parameter set, and it is determined that the matching success and failure determination threshold value needs to be updated (S2103). On the other hand, when it is determined in S2102 that the two similarity distributions can be separated (separable), it is determined that the matching success and failure determination threshold value does not need to be updated (S2104).

The recipe update information stored in the recipe update information storage unit 214 after the selection of the update item stores information of the similarity distribution separability and information of the update item as information corresponding to the template number. That is, information on whether or not to update the template image, information on whether or not to update the matching success and failure determination threshold value, and information on whether or not to update the image processing parameter set are included.

The method of updating the wafer alignment recipe in the flowchart of FIG. 3 (S308) will be described with reference to FIG. 22.

First, for each template image T included in the recipe, it is determined whether or not the template image is included in the update item in the recipe update information stored in the recipe update information storage unit 214 (S2201).

When it is determined in S2201 that the template image is not included in the update item (No in S2201), it is determined whether or not an image processing parameter set is included in the update item (S2202). When it is determined that the image processing parameter set is included (Yes in S2202), in an image processing parameter set determination step (S2203), the image processing parameter set determination unit 229 determines a suitable image processing parameter set.

On the other hand, when it is determined in S2202 that the image processing parameter set is not included (No in S2202), or after the execution of S2203, it is determined whether or not a matching success and failure determination threshold value is included in the update item (S2204). As a result, when it is determined that the matching success and failure determination threshold value is included (Yes in S2204), in a matching success and failure determination threshold value determination step (S2205), the matching success and failure determination threshold value determination unit 230 determines a suitable matching success and failure determination threshold value.

A method of determining a suitable image processing parameter set in the image processing parameter set determination step (S2203) will be described. When determining the image processing parameter set, an image processing parameter set in which the alignment mark similarity distribution 1501 and the non-alignment mark similarity distribution 1502 do not overlap is searched from the image processing parameter sets included in the image processing parameter information, and the image processing parameter set in which the alignment mark similarity distribution 1501 and the non-alignment mark similarity distribution 1502 do not overlap is set as a suitable image processing parameter set. When the alignment mark similarity distribution 1501 and the non-alignment mark similarity distribution 1502 do not overlap each other, as described with reference to FIG. 16, the lower limit (M1−α×σ1) of the alignment mark similarity distribution 1501-1 is equal to or larger than the upper limit (M2+α×σ2) of the non-alignment mark similarity distribution 1502-1.

A method of determining a suitable matching success and failure determination threshold value in the matching success and failure determination threshold value determination step (S2205) will be described. When determining the matching success and failure determination threshold value, the similarity distribution calculation unit 235 receives the image processing parameter set determined in the image processing parameter set determination step (S2203) and the template image T as input, and calculates the alignment mark similarity distribution and the non-alignment mark similarity distribution. A lower limit of the alignment mark similarity distribution is set as L1=M1−α×σ1, an upper limit of the non-alignment mark similarity distribution is set as U2=M2+α×σ2, and (L1+U2)/2 is set as the suitable matching success and failure determination threshold value.

Figure 22:
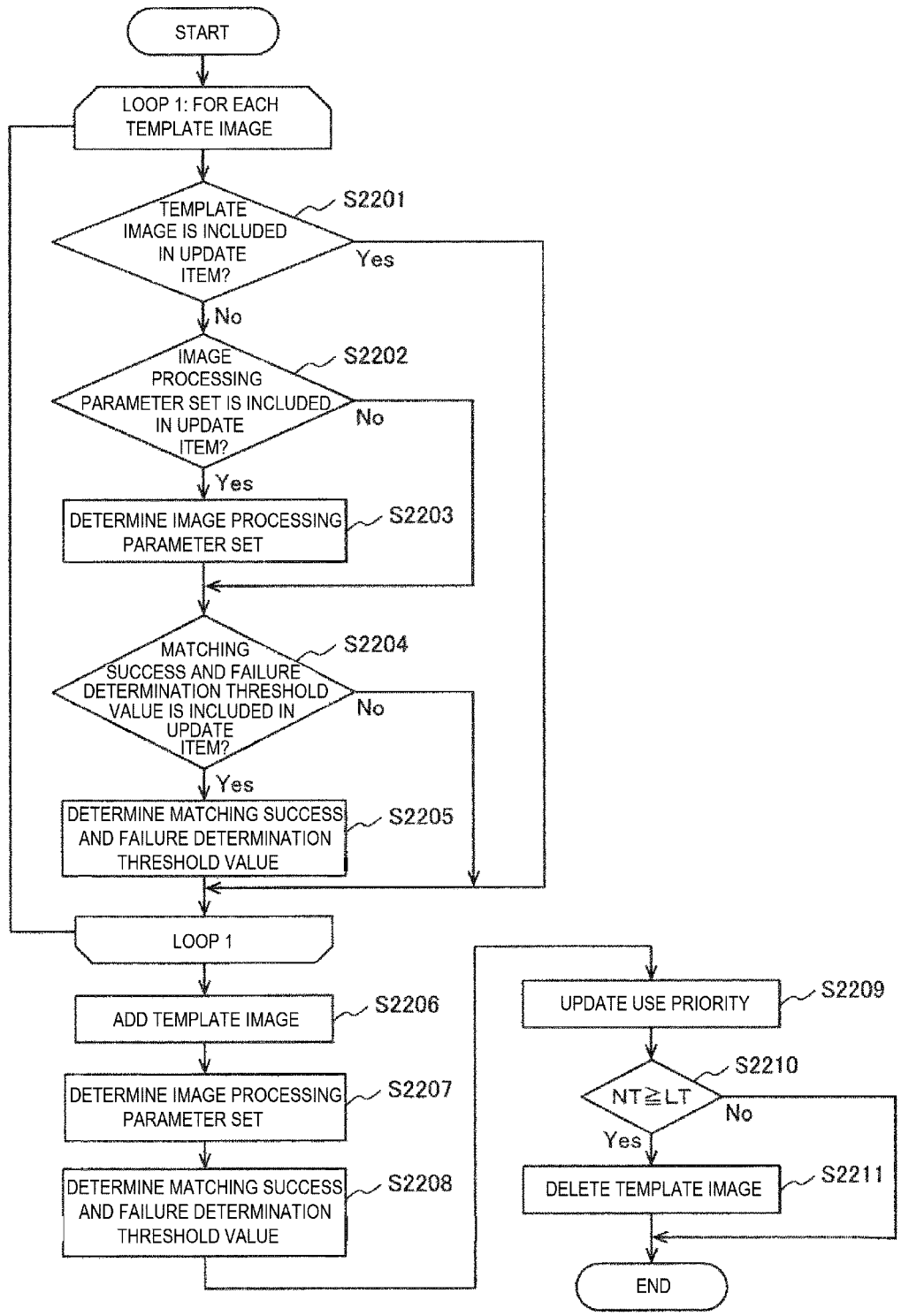
FIG. 22 is a flowchart showing a processing flow of a recipe updating method by a recipe updating unit of the wafer observation apparatus according to the first to fourth embodiments of the invention.

The description will be returned to FIG. 22. For all template images, after executing S2201 to S2205, the template image adding unit 231 adds an image whose attribute is the alignment mark image among the generated images stored in the generated image storage unit 213 to the recipe as a template image TA (S2206), and adds 1 to the template image number NT included in the wafer alignment recipe. When a plurality of images whose attribute is the alignment mark image exist in the generated image storage unit 213, any one of the images is stored in the recipe.

Subsequently, the image processing parameter set determination unit 229 is used to determine an image processing parameter set suitable for the template image TA added to the recipe in S2206 (S2207: the same as S2203). Further, the matching success and failure determination threshold value determination unit 230 is used to determine a matching success and failure determination threshold value suitable for the template image TA added to the recipe in S2206 (S2208: the same as S2205).

Next, in a use priority updating step (S2209), the use priority updating unit 232 updates a use priority associated with the template image information included in the wafer alignment recipe. Thereafter, it is determined whether the template image number NT included in the wafer alignment recipe is equal to or larger than the template image number upper limit LT (S2210).

As a result of the determination in S2210, when it is determined that the template image number NT is equal to or larger than the template image number upper limit LT (Yes in S2210), in order that the template image number NT in the wafer alignment recipe becomes less than the template image number upper limit LT, the template image is deleted from the wafer alignment recipe in order from the one having a low use priority associated with the template image (S2211). When it is determined that NT is not equal to or greater than LT (No in S2210), the update of the wafer alignment recipe is ended.

A method of updating the use priority associated with the template image information included in the wafer alignment in the use priority updating step (S2209) recipe will be described.

First, for each template image T included in the wafer alignment recipe, the similarity distribution calculation unit 235 receives the template image T and the image processing parameter set associated with the template image T as input and calculates the alignment mark similarity distribution 1501 and the non-alignment mark similarity distribution 1502, and calculates a separation degree between the alignment mark similarity distribution 1501 and the non-alignment mark similarity distribution 1502.

As the separation degree between the alignment mark similarity distribution 1501 and the non-alignment mark similarity distribution 1502, for example, L1−U2 (L1: lower limit (M1−α×σ1) of alignment mark similarity distribution, U2: upper limit (M2+α×σ2) of non-alignment mark similarity distribution) or L1/U2 is used.

Subsequently, update is performed so that the use priority associated with the template image becomes higher in descending order of the separation degree between the alignment mark similarity distribution and the non-alignment mark similarity distribution calculated for each template image T.

In the template image information data included in the updated wafer alignment recipe, a template image file, the matching success and failure determination threshold value TH, the image processing parameter number, and the use priority information are registered in association with the template number.

Comparing a data structure of the template image information before the recipe update and a data structure of the template image information after the recipe update, in the data structure of the template image information after the recipe update, with respect to the data structure of the template image information before the recipe update, the use priority is changed, the matching success and failure determination threshold value (TH), the image processing parameter number, and the use priority are changed, a part of template images are deleted, and a new template image is added.

As described above, in the present embodiment, the alignment mark image and the non-alignment mark image are generated using the peripheral image acquired around the alignment mark, the alignment mark similarity distribution and the non-alignment mark similarity distribution are calculated using the template image and the alignment mark image and the non-alignment mark image, and the update necessity of the wafer alignment recipe is determined using the calculated two similarity distributions.

Then, based on the result of the determination, at least one update item that needs to be updated among the template image, the matching success and failure determination threshold value associated with the template image, or the image processing parameter set associated with the template image is selected, and the recipe is updated based on the selected update item.

Accordingly, according to the present embodiment, it is possible to efficiently update the recipe when a plurality of items are included in the wafer alignment recipe.

Second Embodiment

Next, an apparatus that observes the sample wafer 108 by a method different from that of the first embodiment will be described. The apparatus configuration according to the present embodiment is the same as that of FIGS. 1 and 2 described in the first embodiment. What is different is the similarity distribution calculation step (S1005) of FIG. 10 described using FIG. 14, which is a method in which the similarity distribution calculation unit 235 calculates the alignment mark similarity distribution and the non-alignment mark similarity distribution. Hereinafter, only differences from the first embodiment will be described.

Figure 14:
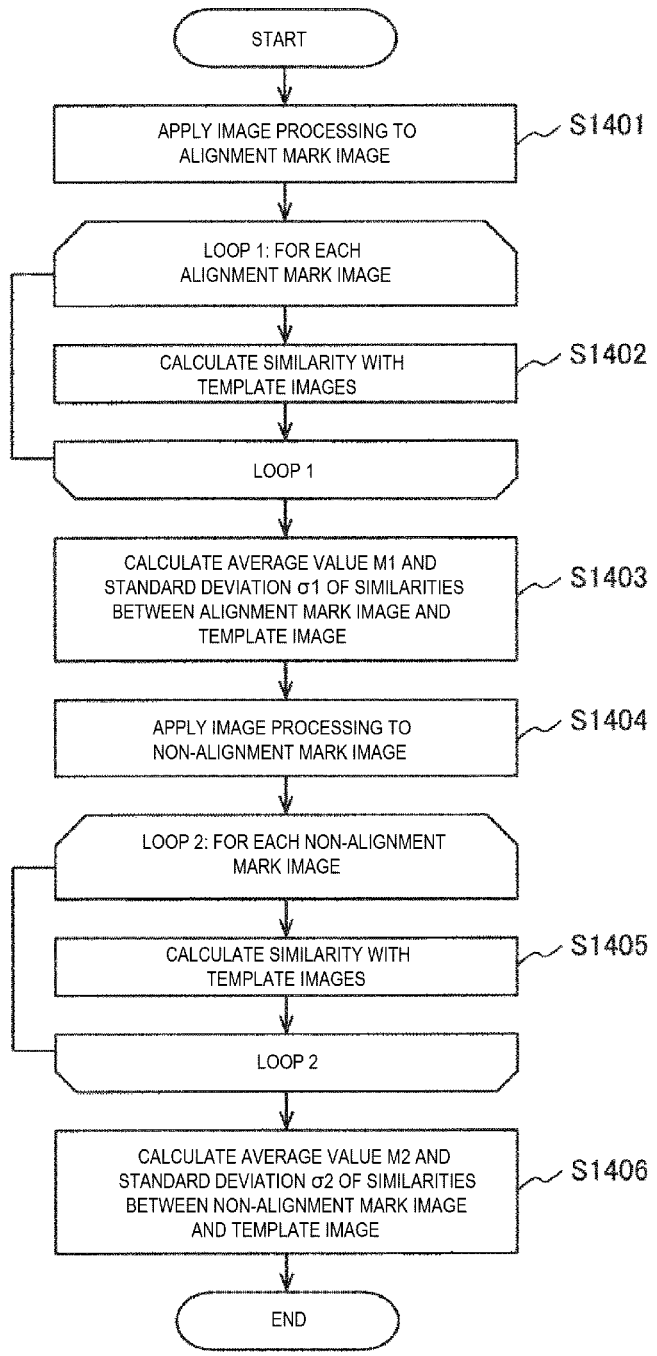
FIG. 14 is a flowchart showing a processing flow of a method of calculating alignment mark similarity distribution and non-alignment mark similarity distribution by a similarity distribution calculation unit of the wafer observation apparatus according to the first, third, and fourth embodiments of the invention.

The similarity distribution calculation unit 235 according to the first embodiment calculates the alignment mark similarity distribution using the template image and the alignment mark image in S1402 of FIG. 14, and calculates the non-alignment mark similarity distribution using the template image and the non-alignment mark image in S1405. At this time, the larger the number of the alignment mark image and the non-alignment mark image, the higher the calculation accuracy of the similarity distribution is.

In contrast, in the present embodiment, an alignment mark image is processed, and alignment mark similarity distribution is calculated using a template image, the alignment mark image before processing and the processed alignment mark image, non-alignment mark similarity distribution is calculated using a template image, a non-alignment mark image before processing and the processed non-alignment mark image.

Accordingly, in the present embodiment, even when the number of alignment mark images generated by the alignment mark image generation unit 233 and non-alignment mark images generated by the non-alignment mark image generation unit 234 are small, similarity distribution can be calculated with high accuracy.

Figure 23:
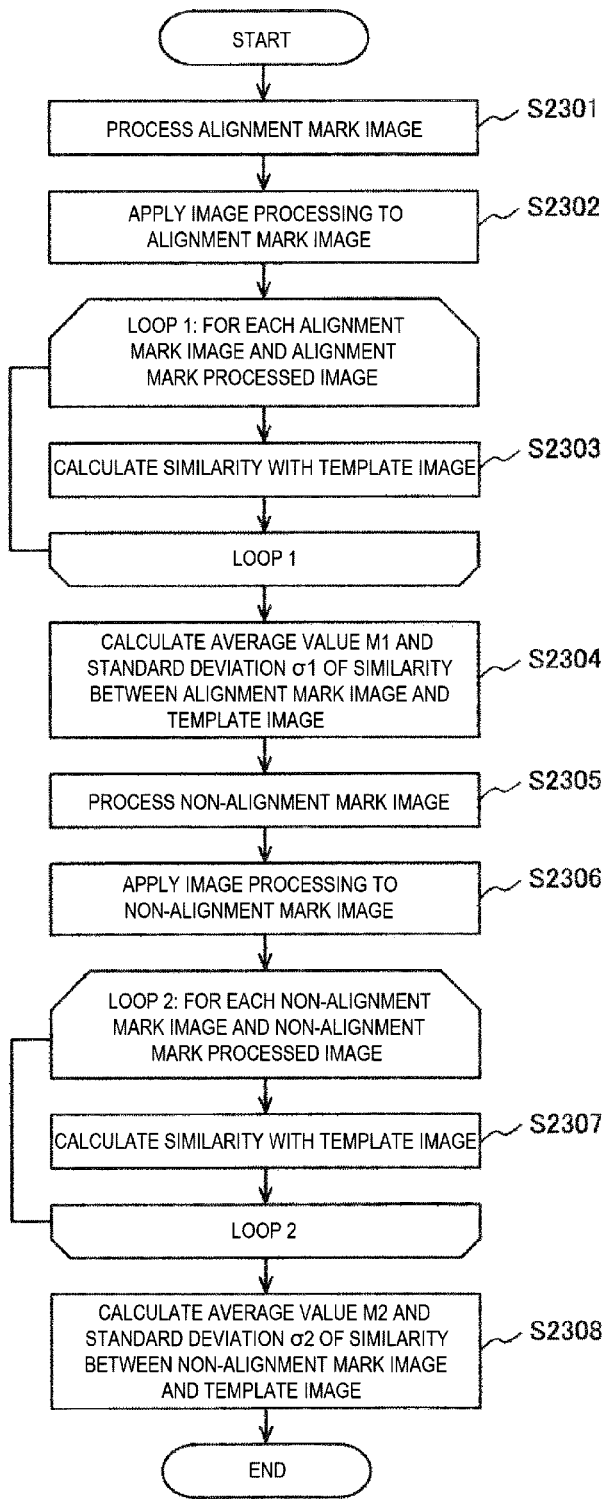
FIG. 23 is a flowchart showing a processing flow of a method of calculating the alignment mark similarity distribution and the non-alignment mark similarity distribution by a similarity distribution calculation unit of the wafer observation apparatus according to the second embodiment of the invention.

A method according to the present embodiment of calculating the alignment mark similarity distribution and the non-alignment mark similarity distribution by the similarity distribution calculation unit 235 will be described with reference to FIG. 23.

First, the alignment mark image stored in the generated image storage unit 213 is processed to obtain an alignment mark processed image (S2301). Examples of the type of processing include noise application, luminance value inversion, blurring, and the like.

Figure 24:
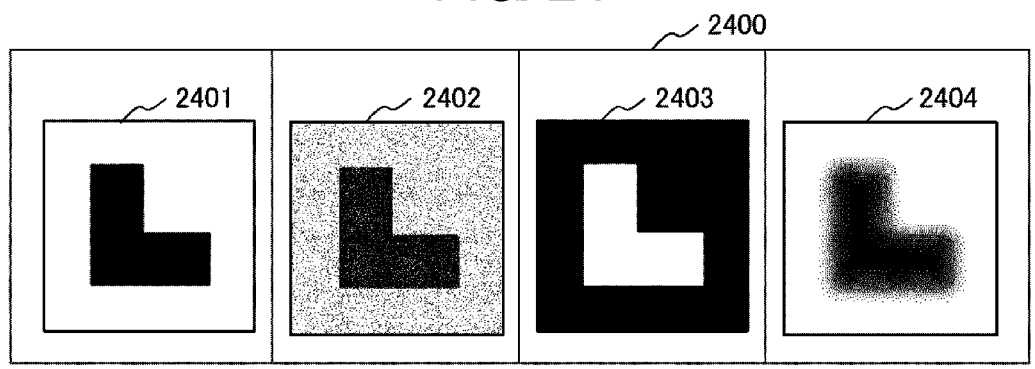
FIG. 24 is a table showing an example of a processed alignment mark image or non-alignment mark image according to the second embodiment of the invention.

A table 2400 of FIG. 24 is an example of an image before processing and images after processing. An image such as an image 2402 is obtained by applying noise to an image 2401 before processing, and an image such as an image 2403 is obtained by applying luminance value inversion to the image 2401, and an image such as an image 2404 is obtained by performing blurring on the image 2401.

Subsequently, image processing is applied to an input template image, the alignment mark image stored in the generated image storage unit 213, and the alignment mark processed image obtained in S2301 using an input image processing parameter set (S2302), and the similarity with the template image to which the image processing has been applied is calculated for each alignment mark image to which image processing has been applied and each alignment mark processed image to which image processing has been applied (S2303).

An average value M1 and a standard deviation al of the one or more similarities calculated in S2303 are calculated (S2304), and a normal distribution having the average value M1 and the standard deviation al is defined as a similarity distribution between the template image and the alignment mark image (hereinafter, referred to as alignment mark similarity distribution).

Subsequently, the non-alignment mark image stored in the generated image storage unit 213 is processed to obtain a non-alignment mark processed image (S2305). Subsequently, image processing is applied to the input template image, the non-alignment mark image stored in the generated image storage unit 213, and the non-alignment mark processed image obtained in S2305 using the input image processing parameter set (S2306), and the similarity with the template image to which the image processing has been applied is calculated for each alignment mark image to which image processing has been applied and each non-alignment mark processed image to which image processing has been applied (S2307).

An average value M2 and a standard deviation σ2 of one or more similarities calculated in S2307 are calculated (S2308), and a normal distribution having the average value M2 and the standard deviation σ2 is defined as a similarity distribution between the template image and the non-alignment mark image (hereinafter, referred to as non-alignment mark similarity distribution).

As described above, according to the present embodiment, even when the number of the alignment mark images generated by the alignment mark image generation unit 233 and the non-alignment mark images generated by the non-alignment mark image generation unit 234 are small, by processing the image and calculating the similarity distribution using the processed image, the similarity distribution can be calculated with high accuracy, and the recipe can be efficiently updated when the wafer alignment recipe includes a plurality of items, as in the first embodiment.

Third Embodiment

Next, an apparatus that observes a sample wafer by a method different from those of the first and second embodiments will be described. The apparatus configuration according to the present embodiment is the same as that of FIGS. 1 and 2. The difference lies in the method of determining the update necessity of the wafer alignment recipe by the recipe update necessity determination unit 223 in the recipe update necessity determination step (S306) of the flowchart shown in FIG. 3 and the method of selecting an item that needs to be updated by the update item selection unit 224 in the update item selection step (S307). Hereinafter, only differences from the first and second embodiments will be described.

In the first and second embodiments, using the flowchart of FIG. 10, a method of acquiring the image around the alignment mark (peripheral image) and determining the update necessity of the wafer alignment recipe using the peripheral image is described. On the other hand, in the present embodiment, a method of determining the update necessity of the wafer alignment recipe using information obtained by wafer observation, particularly information obtained when inspecting a defect portion will be described.

The wafer observation information used when observing the wafer according to the present embodiment includes a type name, a step name, an image capturing condition, a wafer observation coordinate, and a defect image rate threshold value.

A method of observing the wafer in the present embodiment corresponding to the method in the first embodiment of observing the wafer by the wafer observation unit 206 in the wafer observation step (S305) described in the flowchart of FIG. 3 will be described with reference to FIG. 25.

Figure 25:
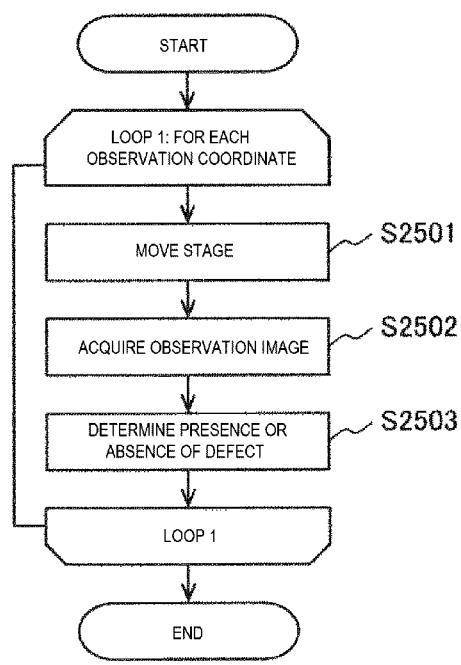
FIG. 25 is a flowchart showing a processing flow of a method of observing a wafer by a wafer observation unit of a wafer observation apparatus according to the third embodiment of the invention.

In the present embodiment, as shown in FIG. 25, for each wafer observation coordinate of the wafer observation information, the stage is moved to a coordinate indicated by the wafer observation coordinate (S2501), an observation image is acquired using the image acquisition unit 205 (S2502), and presence or absence of a defect in the acquired observation image is determined (S2503).

In a defect observation result after wafer observation, for each wafer observation coordinate, a file name of the observation image acquired in S2502 and the information on the presence or absence of the defect determined in S2503 are associated.

In the determination of the presence or absence of the defect in S2503, a method of acquiring, in addition to the observation image, an image (reference image) that includes a pattern similar to the observation image but does not have a defect and determining the presence or absence of the defect by comparing the observation image and the reference image may be used, and a machine learning defect presence and absence determination method may be used.

Figure 26:
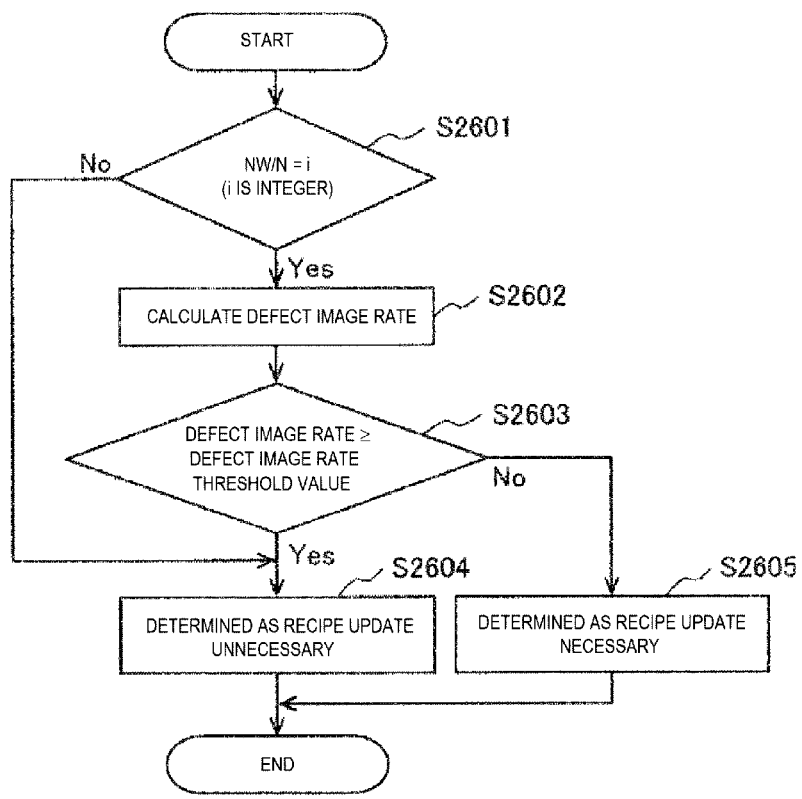
FIG. 26 is a flowchart showing a processing flow of determining update necessity of a wafer alignment recipe by a recipe update necessity determination unit of the wafer observation apparatus according to the third embodiment of the invention.

A method of determining the update necessity of the recipe according to the present embodiment corresponding to the recipe update necessity determination method (S306) described in the first embodiment will be described with reference to FIG. 26.

First, it is determined whether or not the observation number NW is an integral multiple of a predetermined number N (NW/N=i:N is a recipe update necessity confirmation frequency, i is an integer) (S2601: the same as S1001 in the first embodiment).

When it is determined in S2601 that the observation number is an integral multiple of the predetermined number N (Yes in S2601), a ratio of an image determined to have defects in S2503 (defect image rate) among the observation images acquired in S2502 (S2602) is calculated, and it is determined whether or not the calculated defect image rate is equal to or larger than a defect image rate threshold value of the wafer observation information (S2603).

When it is determined in S2603 that the defect image rate is equal to or larger than the defect image rate threshold value (Yes in S2603), it is determined that the wafer alignment in the wafer alignment step (S304) described in the first embodiment is successful, and it is determined that the wafer alignment recipe does not need to be updated (S2604). When it is determined in S2601 that the observation number is not the predetermined number (No in S2601), it is determined that the wafer alignment recipe does not need to be updated (S2604).

When it is determined in S2603 that the defect image rate is less than the defect image rate threshold value (No in S2603), it is determined that the wafer alignment in S304 fails and that the wafer alignment recipe needs to be updated (S2605).

Figure 27:
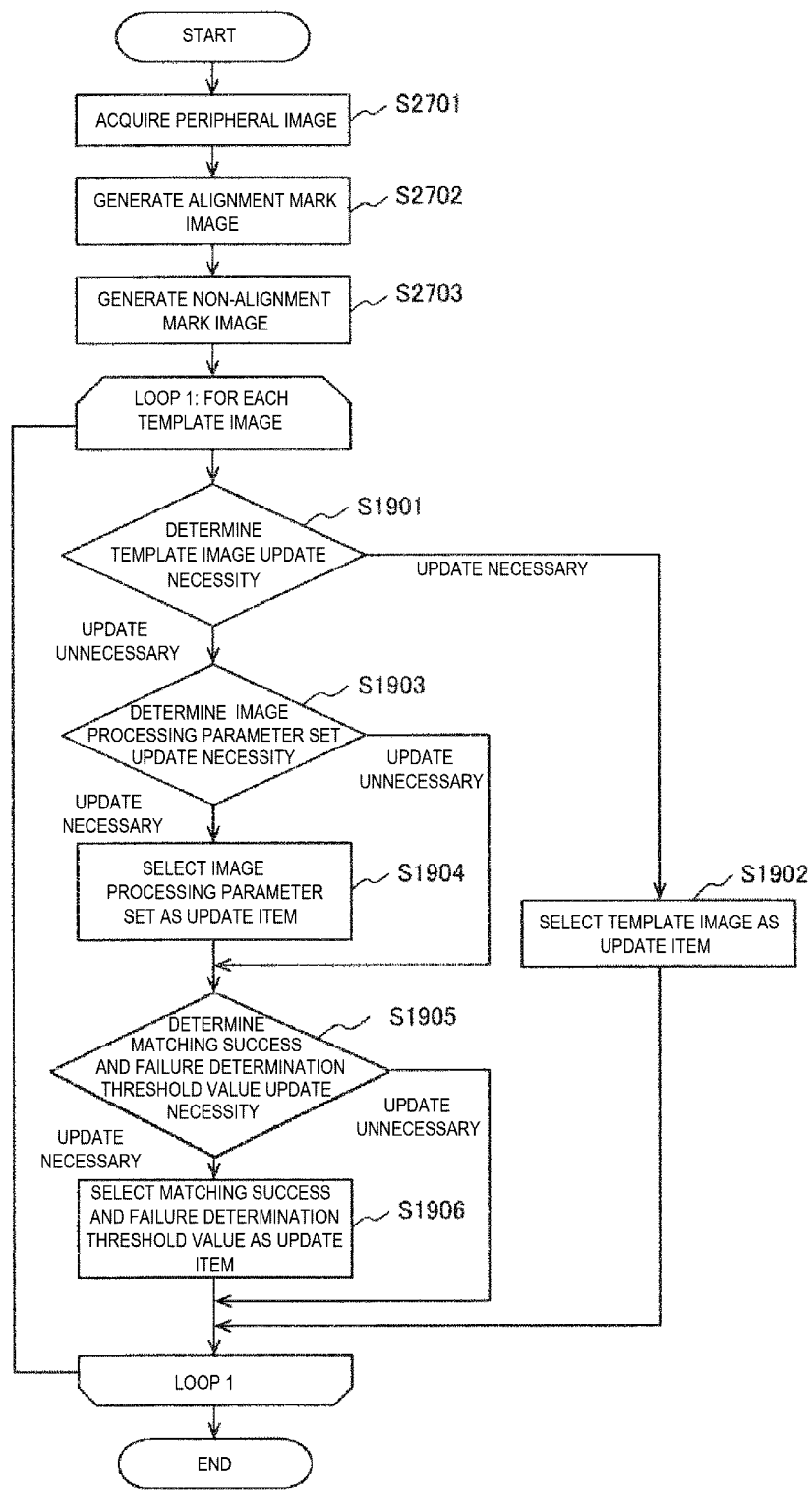
FIG. 27 is a flowchart showing a processing flow of a method of selecting an item that needs to be updated by an update item selection unit of the wafer observation apparatus according to the third and fourth embodiments of the invention.

A method of selecting an update item according to the present embodiment corresponding to the update item selection method (S307) described in the first embodiment will be described with reference to FIG. 27. In the present embodiment, unlike the case of the first embodiment, at the time of determining the update necessity of the recipe (S306), the peripheral image is not acquired, the alignment mark image is not generated, and the non-alignment mark image is not generated. Therefore, in the present embodiment, the above processing is executed when an update item is selected.

First, in the present embodiment, after the alignment image acquisition step (S803) described using FIG. 8 for the detailed steps of the wafer alignment step S304 according to the first embodiment, a peripheral image is acquired in a range indicated by a capturing range R centering on a detection position of the alignment mark in the alignment image acquired in S803 (S2701), an alignment mark image is generated based on the peripheral image using the alignment mark image generation unit 233 (S2702), a non-alignment mark image is generated based on the peripheral image using the non-alignment mark image generation unit 234 (S2703), and the alignment mark image and the non-alignment mark image are stored in the generated image storage unit 213.

Figure 19:
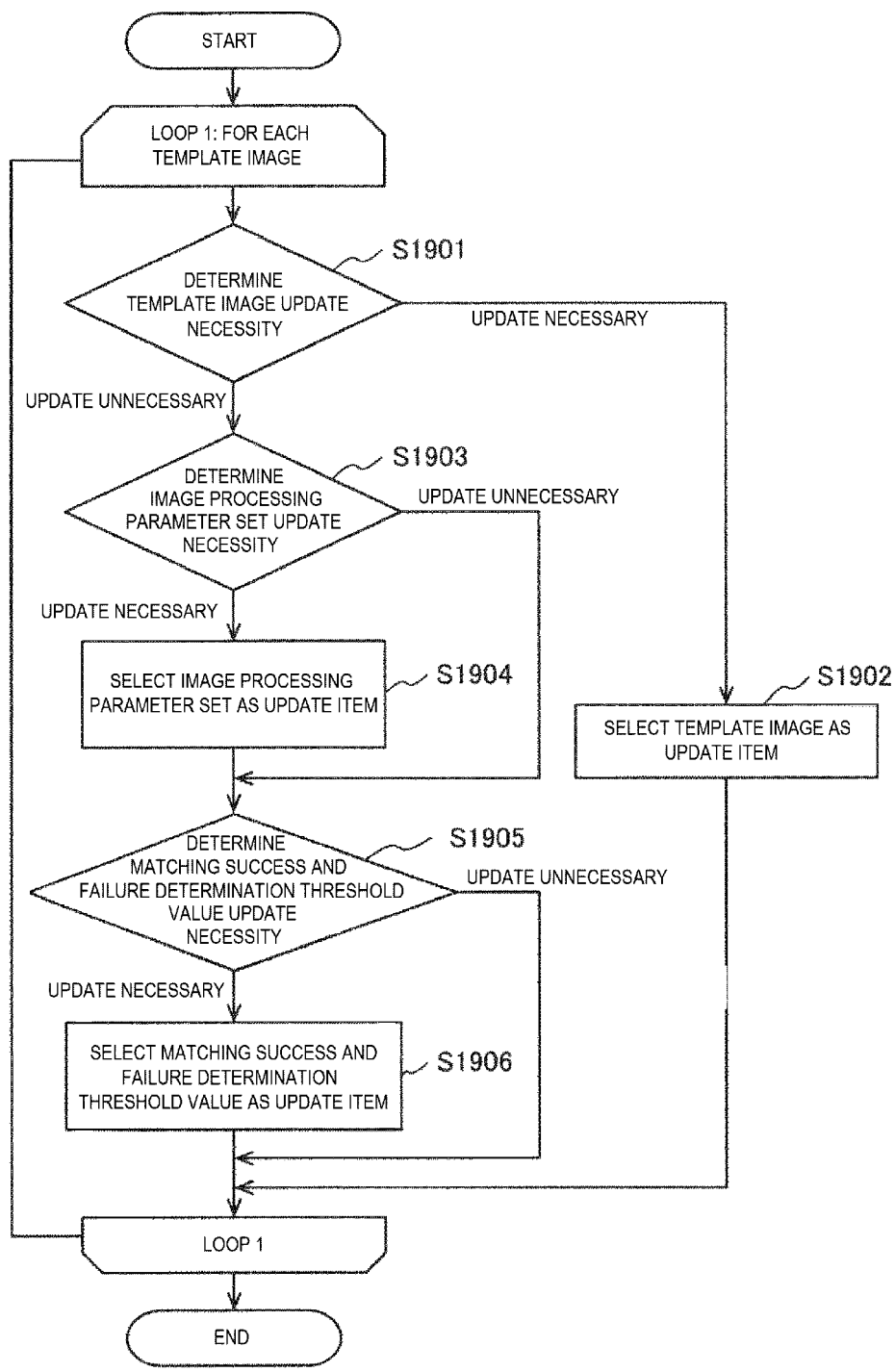
FIG. 19 is a flowchart showing a processing flow of a method of selecting an item that needs to be updated by an update item selection unit of the wafer observation apparatus according to the first and second embodiments of the invention.

The processing after the execution of S2703 is the same as the processing in S1901 to S1906 in FIG. 19 described in the first embodiment, and a description thereof will be omitted.

As described above, according to the present embodiment, it is possible to determine the update necessity of the wafer alignment recipe using the inspection result of the defect portion, and as in the first and second embodiments, it is possible to efficiently update the recipe when the wafer alignment recipe includes a plurality of items.

Fourth Embodiment

Next, an apparatus that observes the sample wafer 108 by a method different from those of the first to third embodiments will be described. The apparatus configuration according to the present embodiment is the same as that of the third embodiment in the same manner as in FIGS. 1 and 2 described in the first embodiment. What is different from the third embodiment is a method of observing the sample wafer 108 by the wafer observation unit 206 and a method of determining the update necessity of the wafer alignment recipe 300 by the recipe update necessity determination unit 223. Hereinafter, only differences from the third embodiment will be described.

In the third embodiment, the method of determining the update necessity of the wafer alignment recipe using information obtained when inspecting a defect portion is described. In the present embodiment, a method of determining the update necessity of the wafer alignment recipe using information obtained when a dimension measurement of a pattern formed on the sample wafer 108 is performed will be described.

When measuring the dimension of the pattern, in order to capture an image of a measurement location without position deviation, the coordinate on the sample wafer 108 is known, and an addressing pattern around the measurement location is detected (hereinafter, referred to as addressing). In addressing, the addressing pattern is detected by template matching as in the wafer alignment, using an addressing template image registered in advance.

The wafer observation information used when observing the wafer according to the present embodiment includes type name information, step name information, image capturing condition, an addressing coordinate, an addressing template image, an addressing success and failure determination threshold value, and an addressing success rate threshold value.

Figure 28:
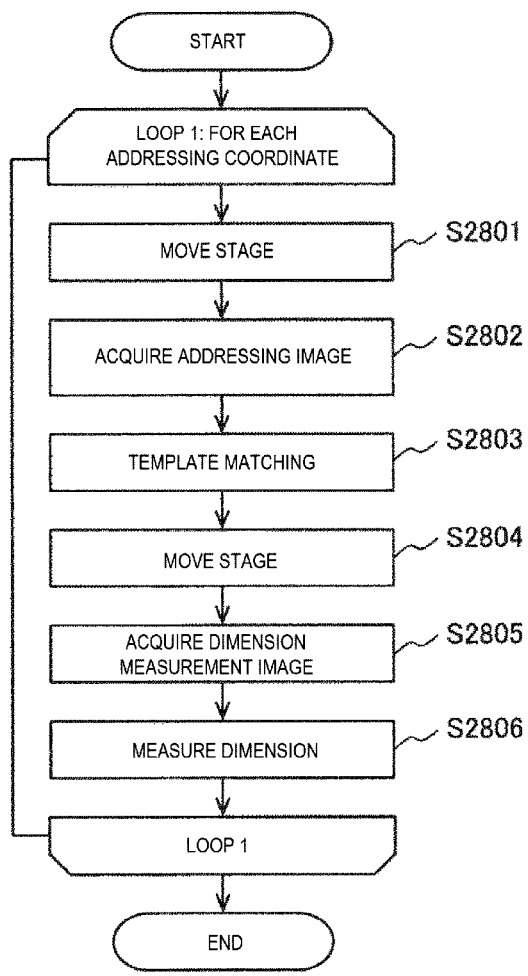
FIG. 28 is a flowchart showing a processing flow of a method of observing a wafer by a wafer observation unit of a wafer observation apparatus according to the fourth embodiment of the invention.

A wafer observation method in the present embodiment corresponding to the method of observing the wafer by the wafer observation unit 206 in the wafer observation step (S305) described in the first embodiment will be described with reference to FIG. 28.

First, a stage is moved to the coordinate indicated by the addressing coordinate for each addressing coordinate of the wafer observation information (S2801), and an addressing image is acquired using the image acquisition unit 205 (S2802). Next, template matching is performed using the acquired addressing image and an addressing template image stored in the wafer observation information, and an addressing pattern is detected (S2803).

Next, the stage is moved to a location where the dimension measurement is performed based on a position of the addressing pattern detected in S2803 (S2804), a dimension measurement image is acquired using the image acquisition unit 205 (S2805), and a dimension of the pattern is measured using the acquired image (S2806).

In an addressing result after observing the sample wafer 108, for each addressing coordinate, a maximum similarity is associated with the coordinate at the location where the dimension is measured, a file name of the addressing image, and the detection position candidate output by the template matching in S2803.

Next, a recipe update necessity determination method according to the present embodiment corresponding to the recipe update necessity determination method (S306) described in the first embodiment will be described with reference to FIG. 29.

First, it is determined whether or not the observation number NW is an integral multiple of a predetermined number N (NW/N=i:N is the recipe update necessity confirmation frequency, i is an integer) (S2901: the same as S1001 in the first embodiment). When it is determined in S2901 that the observation number is an integral multiple of the predetermined number N, among the addressing images acquired in S2802, a ratio of images whose similarity with the addressing template image is equal to or larger than the addressing success and failure determination threshold value (addressing success rate) is calculated (S2902), and it is determined whether or not the calculated addressing success rate is equal to or larger than an addressing success rate threshold value of the wafer observation information (S2903).

When it is determined in S2903 that the addressing success rate is equal to or larger than the addressing success rate threshold value (Yes in S2903), it is determined in S304 that the wafer alignment is successful, and it is determined that the wafer alignment recipe does not need to be updated (S2904). Even when it is determined in S2901 that the observation number is not an integral multiple of the predetermined number, it is determined that the wafer alignment recipe does not need to be updated (S2904).

On the other hand, when it is determined in S2903 that the addressing success rate is less than the addressing success rate threshold value, it is determined in S304 that the wafer alignment fails, and it is determined that the wafer alignment recipe needs to be updated (S2905).

As described above, according to the present embodiment, it is possible to determine the update necessity of the wafer alignment recipe using the addressing result for the dimension measurement of the pattern, and as in the first to the third embodiments, it is possible to efficiently update the recipe when the wafer alignment recipe includes a plurality of items.

While the invention has been described in detail based on the embodiments, the invention is not limited to the above-described embodiments, and various modifications can be made without departing from the scope of the invention. For example, the embodiments described above have been described in detail for easy understanding of the invention, and the invention is not necessarily limited to those including all of the configurations described above. Further, apart of the configuration of each embodiment can be added to another configuration, omitted, or replaced with another configuration.

What is claimed is:

1. A wafer observation method of observing a wafer of a semiconductor device using a wafer observation apparatus that observes the wafer, the wafer observation method comprising:

an image acquisition step of acquiring a wafer image; a recipe reading step of reading a wafer alignment recipe including a template image, and a matching success and failure determination threshold value, an image processing parameter set, and a use priority associated with the template image; a wafer alignment execution step of calculating a rotation angle and a position deviation amount of the wafer with respect to a stage of the wafer observation apparatus using the wafer alignment recipe read in the recipe reading step; a wafer observation step of observing the wafer;

a recipe update necessity determination step of determining update necessity of the wafer alignment recipe; a recipe updating step of updating the wafer alignment recipe based on a determination result in the recipe update necessity determination step; an update item selection step of selecting one or more items to be updated among the template image, the matching success and failure determination threshold value, or the image processing parameter set included in the wafer alignment recipe; an alignment mark image generation step of acquiring a peripheral image based on the image of the wafer acquired in the image acquisition step using at least one of a wafer installation error that occurs when installing the wafer on the stage, a stage movement error, or input information from a user and generates an alignment mark image based on the acquired peripheral image;

a non-alignment mark image generation step of generating an image of a location other than the alignment mark as a non-alignment mark image in the peripheral image acquired in the alignment mark image generation step; and a similarity distribution calculation step of calculating an alignment mark similarity distribution using the template image and the alignment mark image and calculating a non-alignment mark similarity distribution using the template image and the non-alignment mark image, wherein the recipe updating step further comprises:

a template image adding step of adding the alignment mark image as the template image to the wafer alignment recipe;

an image processing parameter set determination step of determining a suitable image processing parameter set;

a matching success and failure determination threshold value determination step of determining a suitable success and failure determination threshold value; and a use priority updating step of updating a use priority associated with the template image in the wafer alignment recipe.

2. The wafer observation method according to claim 1, wherein the recipe update necessity determination step further includes a similarity distribution separability determination step of determining whether the alignment mark similarity distribution and the non-alignment mark similarity distribution can be separated using the alignment mark similarity distribution and the non-alignment mark similarity distribution calculated in the similarity distribution calculation step and the matching success and failure threshold value, and determining the update necessity of the wafer alignment recipe based on a determination result in the similarity distribution separability determination step.

3. The wafer observation method according to claim 1, wherein the recipe update necessity determination step determines the update necessity of the wafer alignment recipe using a wafer observation result in the wafer observation step.

4. The wafer observation method according to claim 2, wherein the update item selection step includes:

a template image update necessity determination step of determining update necessity of the template image included in the wafer alignment recipe;

a matching success and failure determination threshold value update necessity determination step of determining update necessity of the matching success and failure determination threshold value included in the wafer alignment recipe; and an image processing parameter set update necessity determination step of determining update necessity of the image processing parameter set included in the wafer alignment recipe.

5. The wafer observation method according to claim 2, wherein a result of determining whether or not the alignment mark similarity distribution and the non-alignment mark similarity distribution can be separated in the similarity distribution separability determination step is displayed on a screen.

6. A wafer observation system comprising:

a scanning electron microscope comprising a movable stage and a detector;

a controller configured to control operations of the scanning electron microscope by executing programmed instructions which, when executed by the controller, cause the controller to perform calculation and imaging operations including acquiring a wafer image by converting a signal received from the detector into a digital image of the wafer;

reading, from a storage medium, a wafer alignment recipe including a template image, a matching success and failure determination threshold value, an image processing parameter set, and a use priority associated with the template image;

calculating a rotation angle and a position deviation amount of the wafer with respect to the movable stage of the wafer observation system using the wafer alignment recipe; and updating the wafer alignment recipe by selecting one or more items to be updated among the template image, the matching success and failure determination threshold value, or the image processing parameter set included in the wafer alignment recipe;

acquiring a peripheral image based on the acquired wafer image using at least one of a wafer installation error that occurs when installing the wafer on the stage, a stage movement error, or input information from a user;

generating an alignment mark image based on the acquired peripheral image;

generating an image of a location other than the alignment mark as a non-alignment mark image in the acquired peripheral image;

calculating an alignment mark similarity distribution using the template image and the alignment mark image;

calculating a non-alignment mark similarity distribution using the template image and the non-alignment mark image;

adding the alignment mark image as the template image to the wafer alignment recipe;

determining a suitable image processing parameter set;

determining a suitable success and failure determination threshold value; and updating a use priority associated with the template image in the wafer alignment recipe.

7. The wafer observation system according to claim 6, wherein the controller is further configured to: determine whether the alignment mark similarity distribution and the non-alignment mark similarity distribution can be separated using the calculated alignment mark similarity distribution and the calculated non-alignment mark similarity distribution and the matching success and failure threshold value; and determine an update necessity of the wafer alignment recipe based on a determination result of whether the alignment mark similarity distribution and the non-alignment mark similarity distribution can be separated.

8. The wafer observation system according to claim 6, wherein the controller is further configured to:
   determine an update necessity of the wafer alignment recipe using a wafer observation result obtained by controlling the scanning electron microscope to observe the wafer of the semiconductor device.

9. The wafer observation system according to claim 7, wherein the controller is further configured to:
   determine an update necessity of the template image included in the wafer alignment recipe;
   determine an update necessity of the matching success and failure determination threshold value included in the wafer alignment recipe; and
   determine an update necessity of the image processing parameter set included in the wafer alignment recipe.

10. The wafer observation system according to claim 7, wherein the controller is further configured to: determine whether or not the alignment mark similarity distribution and the non-alignment mark similarity distribution can be separated in the similarity distribution separability determination step is displayed on a screen.

* * * * *